United States Patent
Dutta et al.

(10) Patent No.: US 9,109,162 B2
(45) Date of Patent: Aug. 18, 2015

(54) NARROW SPECTRAL LINE-WIDTH EMISSION PHOSPHORS WITH BROAD BAND EXCITATION EDGE UP TO AND INCLUDING THE BLUE WAVELENGTH REGION

(71) Applicant: Rensselaer Polytechnic Institute, Troy, NY (US)

(72) Inventors: Partha S. Dutta, Clifton Park, NY (US); Aloka Khanna, Troy, NY (US)

(73) Assignee: RENSSELAER POLYTECHNIC INSTITUTE, Troy, NY (US)

( * ) Notice: Subject to any disclaimer, the term of this patent is extended or adjusted under 35 U.S.C. 154(b) by 0 days.

(21) Appl. No.: 14/395,550

(22) PCT Filed: Apr. 19, 2013

(86) PCT No.: PCT/US2013/037366
§ 371 (c)(1),
(2) Date: Oct. 20, 2014

(87) PCT Pub. No.: WO2013/158993
PCT Pub. Date: Oct. 24, 2013

(65) Prior Publication Data
US 2015/0130346 A1   May 14, 2015

Related U.S. Application Data

(60) Provisional application No. 61/687,238, filed on Apr. 20, 2012.

(51) Int. Cl.
*C09K 11/02* (2006.01)
*C09K 11/77* (2006.01)
*F21K 99/00* (2010.01)

(52) U.S. Cl.
CPC ......... *C09K 11/7794* (2013.01); *C09K 11/7708* (2013.01); *C09K 11/7729* (2013.01); *C09K 11/7736* (2013.01); *C09K 11/7765* (2013.01); *F21K 9/56* (2013.01)

(58) Field of Classification Search
CPC ............ C09K 11/7734; C09K 11/643; C09K 2211/182; C01B 13/34; C01B 21/0821; C08K 3/22
USPC .......................... 313/498–512; 428/690–691; 438/26–29; 252/301.4
See application file for complete search history.

(56) References Cited

U.S. PATENT DOCUMENTS 7,828,993 B2    11/2010   Roth
2003/0168636 A1  9/2003   Dobson

FOREIGN PATENT DOCUMENTS

WO    2004041964    5/2004
WO    2005078048    8/2005

(Continued)

OTHER PUBLICATIONS

International Search Report for PCT/US2013/037366 mailed Sep. 12, 2013.

(Continued)

*Primary Examiner* — Tracie Y Green
(74) *Attorney, Agent, or Firm* — RatnerPrestia

(57) ABSTRACT

Aspects of the present invention provide a family of phosphor compositions that may be used in the field of lighting applications. These phosphor compositions have crystal structures and chemical bond arrangements that enable broad band absorption and excitation using radiation up to and including the blue wavelength region. A preferred embodiment of the phosphor compositions has a general formula of $(A_xA_y \ldots A_z)_{3-(1+q)m}(W_{1-r}Mo_r)O_6:Ln_m,D_{qm}$, wherein $x+y+ \ldots +z=1$; $0 \le r \le 1$; $0 \le q \le 1$; $0 < m \le 0.12$; and A=Divalent element from group IIA and/or IIB (e.g., Mg2+, Ca2+, Sr2+, Ba2+, Zn2+, etc.), W=tungsten with 6+ charge state, Mo=Molybdenum with 6+ charge state, Ln=Trivalent rare earth lanthanide element (e.g., Ce3+ to Lu3+), D=Monovalent element from group IA and/or IB (e.g., Li1+, Na1+, Cu1+, etc.), and O=Oxygen ($O^{2-}$).

25 Claims, 16 Drawing Sheets

(56) References Cited

FOREIGN PATENT DOCUMENTS

| WO | 2005113705 | 12/2005 |
|---|---|---|
| WO | 2008065567 | 6/2008 |

OTHER PUBLICATIONS

Written Opinion of the International Searching Authority for International Application No. PCT/US2013/037366, mailed Sep. 12, 2013.

NARROW SPECTRAL LINE-WIDTH EMISSION PHOSPHORS WITH BROAD BAND EXCITATION EDGE UP TO AND INCLUDING THE BLUE WAVELENGTH REGION

CROSS REFERENCE TO RELATED APPLICATIONS

The present application is the U.S. National Phase Application of PCT/US2013/037366 which claims priority to U.S. Provisional Application, Ser. No. 61/687,238, filed Apr. 20, 2012, entitled NARROW SPECTRAL LINE-WIDTH EMISSION PHOSPHORS WITH BROAD BAND EXCITATION EDGE IN THE BLUE WAVELENGTH REGION. The contents of such applications are incorporated fully herein by reference.

STATEMENT REGARDING FEDERALLY SPONSORED RESEARCH & DEVELOPMENT

The present invention was made with United States Government support under contract number EEC-0812056, awarded by the National Science Foundation, and contract number C090145, awarded by NYSTAR. The United States Government may have certain rights to the invention.

FIELD OF THE INVENTION

The present invention generally relates to a phosphor composition for lighting and display applications. In particular, the phosphor composition enables broad band absorption and excitation of light up to and including the blue wavelength region, and wavelength conversion to longer wavelength regions.

BACKGROUND OF THE INVENTION

The development of solid state semiconductor devices, in particular light emitting diodes (LEDs), has opened up the possibility of a new generation of energy efficient lighting solutions. Development of LEDs that emit light in the blue/ultraviolet part of the electromagnetic spectrum has resulted in practical applications of white light sources based on LEDs (i.e., "white LEDs"). Due to their long operational lives and high efficiency, it is predicted that white LEDs could eventually replace incandescent, fluorescent, and other conventional light sources.

Techniques have been developed for converting the light emitted from LEDs to useful white light for illumination, as well as other purposes. For these techniques, phosphor layers are typically placed in close proximity to a light emitting surface of the LED chip from which they derive their excitation energy. The phosphor absorbs radiation energy in one portion of the electromagnetic spectrum and emits energy in another portion of the electromagnetic spectrum. Phosphors, for example, may emit radiation in the visible portion of the electromagnetic spectrum in response to excitation by electromagnetic energy outside the visible range.

There presently exist significant obstacles in the development of phosphor-converted white LEDS with superior characteristics. One such obstacle includes the lack of narrow-emitting red, orange, yellow, green or other visible wavelength phosphors that are effectively excited by blue or near-UV LEDs.

SUMMARY OF THE INVENTION

A composition according to one aspect of the invention comprises a phosphor having a general formula of $(A_xA_y \ldots A_z)_{3-(1+q)m}(W_{1-r}Mo_r)O_6:Ln_m,D_{qm}$, wherein $x+y+\ldots+z=1$; $0 \leq r \leq 1$; $0 \leq q \leq 1$; $0 < m \leq 0.12$; and A=Divalent element from group IIA and/or IIB (e.g., Mg2+, Ca2+, Sr2+, Ba2+, Zn2+, etc.), W=tungsten with 6+ charge state, Mo=Molybdenum with 6+ charge state, Ln=Trivalent rare earth lanthanide element (e.g., Ce3+ to Lu3+), D=Monovalent element from group IA and/or IB (e.g., Li1+, Na1+, Cu1+, etc.), and O=Oxygen ($O^{2-}$). Examples of this phosphor may include the composition $Ca_{2.88}MoO_6:Eu_{0.06}Na_{0.06}$, as well as the composition $(Sr_{0.4}Ca_{0.2}Mg_{0.1}Ba_{0.2}Zn_{0.1})_{2.8}(Mo_{0.4}W_{0.6})O_6:Eu_{0.1}Li_{0.1}$.

A composition according to another aspect of the invention provides a phosphor having a general formula of $(A_xA_y \ldots A_z)_{1-(1+q)m}(W_{1-r}Mo_r)O_3:Ln_m,D_{qm}$, wherein $x+y+\ldots+z=1$; $0 \leq r \leq 1$; $0 \leq q \leq 1$; $0 < m \leq 0.24$; and A=Divalent element from group IIA and/or IIB (e.g., Mg2+, Ca2+, Sr2+, Ba2+, Zn2+, etc.), W=tungsten with 4+ charge state, Mo=Molybdenum with 4+ charge state, Ln=Trivalent rare earth lanthanide element (e.g., Ce3+ to Lu3+), D=Monovalent element from group IA and/or IB (e.g., Li1+, Na1+, Cu1+, etc.), and O=Oxygen ($O^{2-}$). An example of this phosphor composition may include the composition $Ca_{0.80}WO_3:Eu_{0.1}Na_{0.1}$.

A composition according to a third aspect of the invention provides a phosphor having a general formula of $(A_xA_y \ldots A_z)_{3-(1+q)m}(B_xB_y \ldots B_z)_{2-k}(W_{1-r}Mo_r)O_9:Ln_{m+k},D_{qm}$, wherein $x+y+\ldots+z=1$; $0 \leq k \leq 1$; $0 \leq r \leq 1$; $0 \leq q \leq 1$; $0 < m \leq 0.24$; and A=Divalent element from group IIA and/or IIB (e.g., Mg2+, Ca2+, Sr2+, Ba2+, Zn2+, etc.), B=Trivalent element from group IIIA, IIIB or Rare Earth Lanthanide elements (e.g., Sc3+, Y3+, La3+, B3+, Al3+, Ga3+, Ce3+ to Lu3+, etc.), W=Tungsten with 6+ charge state, Mo=Molybdenum with 6+ charge state, Ln=Trivalent rare earth lanthanide element (e.g., Ce3+ to Lu3+), D=Monovalent element from group IA and/or IB (e.g., Li1+, Na1+, Cu1+, etc.), and O=Oxygen ($O^{2-}$). An example of this phosphor composition may include the composition $Mg_{2.8}Y_{1.5}WO_9:Eu_{0.6}Na_{0.1}$.

A composition according to a fourth aspect of the invention provides a phosphor having a general formula of $(A_xA_y \ldots A_z)_{2-m}(W_{1-r}Mo_r)_2O_7:Ln_m$; wherein $x+y+\ldots+z=1$; $0 \leq r \leq 1$; $0 < m \leq 1$; and A=Trivalent element from group IIIA, IIIB or Rare Earth Lanthanide elements (e.g., Sc3+, Y3+, La3+, B3+, Al3+, Ga3+, Ce3+ to Lu3+, etc.), W=Tungsten with 4+ charge state, Mo=Molybdenum with 4+ charge state, Ln=Trivalent rare earth lanthanide element (e.g., Ce3+ to Lu3+), D=Monovalent element from group IA and/or IB (e.g., Li1+, Na1+, Cu1+, etc.), and O=Oxygen ($O^{2-}$). An example of this phosphor composition may include the composition $Y_{1.5}Mo_2O_7:Eu_{0.5}$.

A composition according to a fifth aspect of the invention provides a phosphor having a general formula of $(A_xA_y \ldots A_z)_{2-(1+q)m}(V_pNb_rTa_s)_2O_7:Ln_m,D_{qm}$; wherein $x+y+\ldots+z=1$; $p+r+s=1$; $0 \leq q \leq 1$; $0 < m \leq 0.24$; and A=Divalent element from group IIA and/or IIB (e.g., Mg2+, Ca2+, Sr2+, Ba2+, Zn2+, etc.), V=Vanadium with 5+ charge state, Nb=Niobium with 5+ charge state, Ta=Tantalum with 5+ charge state, Ln=Trivalent rare earth lanthanide element (e.g., Ce3+ to Lu3+), D=Monovalent element from group IA and/or IB (e.g., Li1+, Na1+, Cu1+, etc.), and O=Oxygen ($O^{2-}$). Examples of this phosphor may include the composition $Ca_{1.88}V_2O_7:Eu_{0.06}Na_{0.06}$, as well as the composition $Sr_{0.9}Ca_{0.9}V_{0.8}Nb_{1.2}O_7:Eu_{0.1}Li_{0.1}$.

A composition according to a sixth aspect of the invention provides a phosphor having a general formula of $(A_xA_y \ldots A_z)_{3-(1+q)m}(V_pNb_rTa_s)_2O_8:Ln_m,D_{qm}$, wherein $x+y+\ldots+z=1$; $p+r+s=1$; $0 \leq q \leq 1$; $0 < m \leq 0.24$; and A=Divalent element from group IIA and/or IIB (e.g., Mg2+, Ca2+, Sr2+, Ba2+, Zn2+, etc.), V=Vanadium with 5+ charge state, Nb=Niobium with 5+ charge state, Ta=Tantalum with 5+ charge state, Ln=Trivalent rare earth lanthanide element (e.g., Ce3+ to Lu3+), D=Monovalent element from group IA and/or IB (e.g., Li1+, Na1+, Cu1+, etc.), and O=Oxygen ($O^{2-}$). Examples of this phosphor may include the composition $Ca_{2.88}Nb_2O_8:Eu_{0.06}Na_{0.06}$, as well as the composition $Sr_{1.8}Ca_{0.8}V_2O_8:Eu_{0.2}Li_{0.2}$.

A composition according to a seventh aspect of the invention provides a phosphor having a general formula of $(A_xA_y \ldots A_z)_{2-(1+q)m}(B_xB_y \ldots B_z)_{1-k}(V_pNb_rTa_s)O_6:Ln_{m+k}, D_{qm}$, wherein $x+y+\ldots+z=1$; $p+r+s=1$; $0 \le q \le 1$; $0 \le k \le 1$; $0 < M \le 0.24$; and A=Divalent element from group IIA and/or IIB (e.g., Mg2+, Ca2+, Sr2+, Ba2+, Zn2+, etc.), B=Trivalent element from group IIIA, IIIB or Rare Earth Lanthanide elements (e.g., Sc3+, Y3+, La3+, B3+, Al3+, Ga3+, Ce3+ to Lu3+, etc.), V=Vanadium with 5+ charge state, Nb=Niobium with 5+ charge state, Ta=Tantalum with 5+ charge state, Ln=Trivalent rare earth lanthanide element (e.g., Ce3+ to Lu3+), D=Monovalent element from group IA and/or IB (e.g., Li1+, Na1+, Cu1+, etc.), and O=Oxygen ($O^{2-}$). An example of this phosphor composition may include the composition $Sr_{1.88}YNbO_6:Eu_{0.06}Na_{0.06}$.

A composition according to an eighth aspect of the invention provides a phosphor having a general formula of $(A_xA_y \ldots A_z)_{3-(1+q)m}(V_pNb_rTa_s)_2O_7:Ln_m,D_{qm}$, wherein $x+y+\ldots+z=1$; $p+r+s=1$; $0 \le q \le 1$; $0 < m \le 0.24$; and A=Divalent element from group IIA and/or IIB (e.g., Mg2+, Ca2+, Sr2+, Ba2+, Zn2+, etc.), V=Vanadium with 4+ charge state, Nb=Niobium with 4+ charge state, Ta=Tantalum with 4+ charge state, Ln=Trivalent rare earth lanthanide element (e.g., Ce3+ to Lu3+), D=Monovalent element from group IA and/or IB (e.g., Li1+, Na1+, Cu1+, etc.), and O=Oxygen ($O^{2-}$). An example of this phosphor composition may include the composition $Sr_{2.8}VNbO_7:Eu_{0.1}Na_{0.1}$.

A composition according to a ninth aspect of the invention provides a phosphor having a general formula of $(A_xA_y A_z)_{2-(1+q)m}(V_pNb_rTa_s)_2O_5:Ln_m,D_{qm}$, wherein $x+y+\ldots+z=1$; $p+r+s=1$; $0 \le q \le 1$; $0 < m \le 0.24$; and A=Divalent element from group IIA and/or IIB (e.g., Mg2+, Ca2+, Sr2+, Ba2+, Zn2+, etc.), V=Vanadium with 3+ charge state, Nb=Niobium with 3+ charge state Ta=Tantalum with 3+ charge state, Ln=Trivalent rare earth lanthanide element (e.g., Ce3+ to Lu3+), D=Monovalent element from group IA and/or IB (e.g., Li1+, Na1+, Cu1+, etc.), and O=Oxygen ($O^{2-}$). An example of this phosphor composition may include the composition $Mg_{1.6}V_2O_5:Eu_{0.2}Na_{0.2}$.

A composition according to a tenth aspect of the invention provides a phosphor having a general formula of $(A_xA_y \ldots A_z)_3(B_xB_y \ldots B_z)_{1-m}(W_{1-r}Mo_r)O_6:Ln_m$, wherein $x+y+\ldots+z=1$; $0 \le r \le 1$; $0 < m \le 0.48$; and A=Monovalent element from group IA and/or IB (e.g., Li1+, Na1+, Cu1+, etc.), B=Trivalent element from group IIIA, IIIB or Rare Earth Lanthanide elements (e.g., Sc3+, Y3+, La3+, B3+, Al3+, Ga3+, Ce3+ to Lu3+, etc.), W=Tungsten with 6+ charge state, Mo=Molybdenum with 6+ charge state, Ln=Trivalent rare earth lanthanide element (e.g., Ce3+ to Lu3+), and O=Oxygen ($O^{2-}$). An example of this phosphor composition may include the composition $Na_3Gd_{0.7}MoO_6:Eu_{0.3}$.

Additional embodiments of the present invention include light emitting and light modulation devices having a source for ultraviolet or visible radiation, power leads providing current to the source for emitting the radiation, and one or more phosphors of the aforementioned embodiments of the present invention.

BRIEF DESCRIPTION OF DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Embodiments of the present invention provide phosphor compositions that may be used in lighting systems, such as LEDs, fluorescent tubes, and the like. The applications of lighting systems using the phosphor compositions described throughout the specification, however, are not limited to any particular preferred general illumination purposes. They may include any lighting systems currently understood by those skilled in the art.

The phosphor compositions according to embodiments of the present invention have crystal structures and chemical bond arrangements that enable broad band absorption and excitation of light up to and including the blue wavelength regions (e.g., 400-490 nm), and wavelength conversions to longer wavelength regions. The phosphor compositions have narrow spectral line-width (e.g. full width at half maximum that is less than 5 nm) suitable for high efficiency white light LED fabrication. The phosphors provide emission in green (e.g., 550 nm), yellow (e.g., 575 nm), orange (e.g., 615 nm), and red (e.g., 650 nm) wavelengths. In addition to wavelength conversions, phosphor compositions according to aspects of the present invention may be used for varying temporal characteristics of light, such as intensity, polarization, and spatial distribution.

Commercial phosphor-converted white LEDs employ blue (e.g., 400-470 nm) or near-ultraviolet (UV) (e.g., 380-400 nm) LED chips and RY (red-yellow) or tricolor phosphors, respectively, to produce white light with a high CRI (color rendering index) and a low CCT (correlated color temperature). These LEDs require red phosphors in order to maximize efficacy while maintaining high color quality. The phosphor compositions according to embodiments of the present invention result in phosphor-converted white LEDs with superior characteristics. In particular, the phosphor compositions of the present invention result in narrow-emitting red phosphors that are effectively excited by blue (e.g., 400-490 nm) or near-UV (e.g., 380-400 nm) LEDs.

Figure 1:
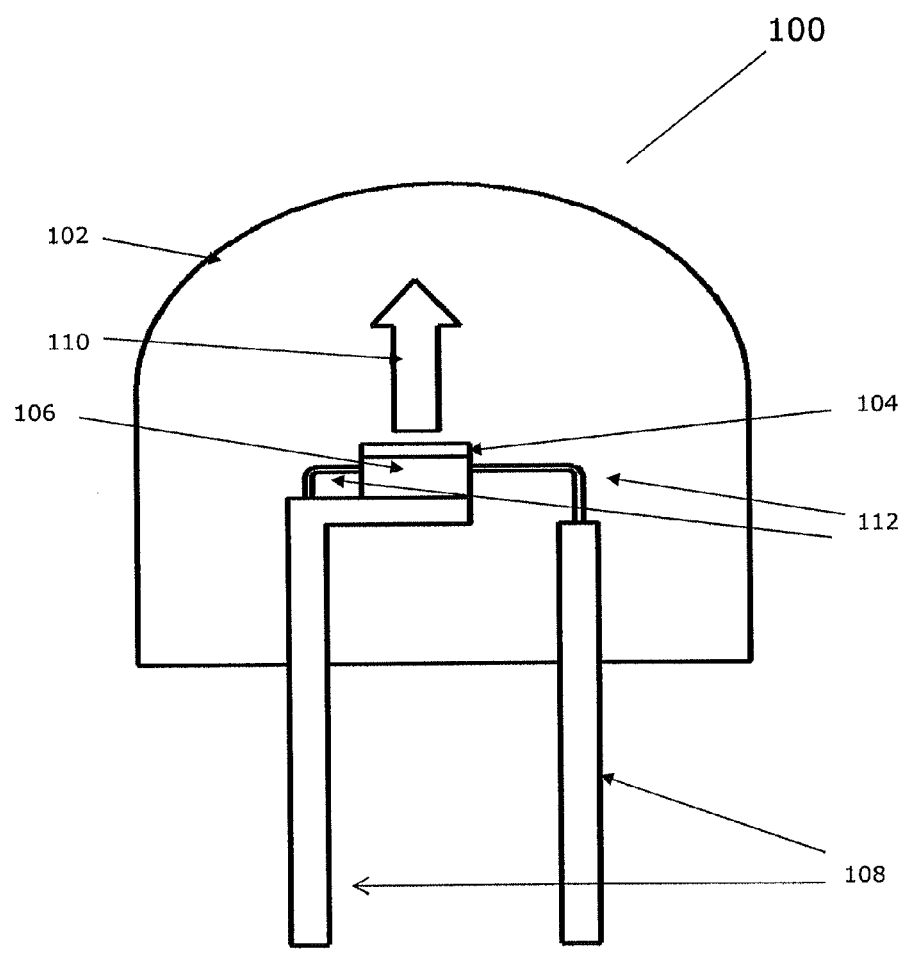
FIG. 1 is a schematic cross-sectional view of an illumination device in accordance with an embodiment of the present invention.

FIG. 1 depicts an LED device 100 according to an aspect of the present invention. LED devices are known in the art. Typically, LED device 100 includes a semiconductor UV or visible radiation source, such as an LED chip 106. Power leads 112, providing current that causes LED chip 106 to emit radiation, are electrically connected to the LED chip 106. Power leads 112 may include thin wires supported by thicker package leads 108. Alternatively, package leads 108 may be directly attached to LED chip 106. LED chip 106 may be encapsulated within a shell 102. Shell 102 may be glass, plastic, or any other material known in the art. Shell 102 is typically transparent with respect to the light produced by LED chip 106.

LED device 100 may further include a phosphor compound 104 according to one embodiment of the present invention. Phosphor compound 104 is typically radiationally coupled to LED chip 106. For example, radiation from LED chip 106 is transmitted to phosphor compound 104, and vice-versa. A phosphor compound 104 that is radiationally coupled to the LED chip 106 may absorb radiation, such as blue or UV light, emitted by LED chip 106. Phosphor compound 104 may then emit radiation in longer wavelengths, such as blue, blue-green, red, or other colors of light.

Phosphor composition 104 may be deposited on LED device 100 by any method presently known by those skilled in the art. As one example, phosphor compound 104 can be formed and applied as a layer onto the surface of LED chip 106. If shell 102 is transparent, the emitted light 110 from LED chip 106 and phosphor compound 104 will be transmitted through shell 102. As another example, the phosphor compound 104 may be formed on the surface of shell 102. As yet another example, phosphor composition 104 (e.g., in powder form) may be mixed with material forming shell 102 (e.g., resin) of LED device 100. The radiation emitted by LED chip 106, mixed with phosphor compound 104, will appear as emitted light 110.

Phosphor compositions of the present invention will now be described. Generally, the phosphor compositions of the present invention may be categorized into two classes. The first class of compositions are trivalent rare earth doped (activated) Group VB and VIB transition metal double perovskites of the $A_2B'B''O_6$ and $AB'B''_2O_7$ type. In this first class of compositions, the transition metal is octahedrally coordinated by oxygen in a 6+ or 5+ charge state, respectively, and occupies the B" site. The A and B' sites are occupied by elements from groups IA, IIA, IIIB, IIB, IIIA, and a lanthanide group. The second class of compositions include trivalent rare earth doped (activated) Group VIB transition metal oxides with the $AB_2O_2$, $ABO_3$, and $A_2B_2O_7$ types. For the second class of compositions, transition metal is in a 3+ or 4+ charge state and occupies the B site. The A site is occupied by elements from groups IA, IIA, IIIB, IIB, IIIA, and a lanthanide group.

For use in solid-state lighting, phosphors should be well excited by near-UV (e.g., 395 nm) or blue (e.g., 465 nm) light. Alkaline earth metal molybdates, for example, have been used as materials for various applications, e.g., laser hosts, X-ray detection, etc. This class of compounds is self-activated due to the luminescence from $MoO_4$ tetrahedral groups in the scheelite host lattice.

Alkaline earth metal tungstates and molybdates serve as excellent host materials for trivalent lanthanide ions like $Eu^{3+}$. These compounds efficiently absorb far-UV radiation via charge transfer state of $WO_4$ and $MoO_4$ groups and then transfer this to $Eu^{3+}$ ions, producing narrow emission lines due to f-f transitions. However, in these compounds, the charge transfer band edge is 330 nm, and luminescence through near-UV and blue excitation is limited to f-f transitions of $Eu^{3+}$ ions. $Eu^{3+}$ ions are parity-forbidden; therefore, the excitation is weak and insufficient for illumination grade LEDs.

Narrow line-width emission is particularly important to lighting. Commercial fluorescent lamps, for example, contain phosphors that emit multitudes of narrow wavelength ranges in the blue, green, and red regions of the visible light spectrum, which mix to provide white light. The narrow line-width is characterized by the wavelength range of emission from the phosphor (full-width at half-maxima of typically less than 5 nm). Narrow line-width emission results in high luminous efficacy by preventing light spill over in the wavelengths outside of the human eye sensitivity curve. For example, in order to obtain the maximum possible luminous efficacy of 375 lm/W at a CRI of 85 and CCT of 3800 K, white light produced from four narrow-emitting sources at 459 nm, 535 nm, 573 nm and 614 nm, respectively, is needed with the relative power of the sources being 0.18, 0.25, 0.22, 0.36, respectively.

The charge transfer state of $MO_4$ (where M=Mo or W) groups is located at a higher energy as compared to that of $MO_6$ groups. The higher coordination number of the transition metal ion in $MO_6$ (where M=Mo or W) complexes leads to longer M-O bonds and lower $M^{6+}$—$O^{2-}$ bond energy, which decides the energy of the charge transfer state. These $MO_6$ complexes are found in various compounds like $A_2CaMO_6$ (where A=Ba or Sr; and M=Mo or W), $R_2MO_6$ (where R=Y or Gd; and M=Mo or W) and $R_6MO_{12}$ (where R=Y or Gd; and M=Mo or W), and when doped with $Eu^{3+}$, the charge transfer band edges are around 430 nm, 400 nm, and 430 nm, and the emission maxima are around 594 nm and 615 nm, respectively.

While $R_2MO_6$ compounds have a shorter charge transfer band (CTB) edge, $A_2CaMO_6$ (where A=Ba or Sr; and M=Mo or W) type compounds favor the magnetic dipole transition of $Eu^{3+}$ ion over the electric dipole transition, resulting in a peak emission wavelength of 594 nm instead of 615 nm. Further, the synthesis of pure hexagonal phase of $R_6MO_{12}$ (where R=Y or Gd; and M=Mo or W) doped with $Eu^{3+}$, exhibiting a CTB edge of 430 nm, is difficult. Therefore, in embodiments of the present invention, another series of compounds have been doped with $Eu^{3+}$, which comprise $MO_6$ complexes (where M=Mo or W) with specific crystal structure that results in extension of the charge transfer band in the blue wavelength region (e.g., 400-490 nm). Using the same classes of compounds, but using different dopant species $Ho^{3+}$, $Dy^{3+}$, $Pr^{3+}$, $Sm^{3+}$, $Tb^{3+}$, etc., narrow spectral lines with peak emission at different wavelengths in the visible spectrum range (e.g., 500-700 nm) is possible.

According to embodiments of the present invention, various phosphor compositions have been synthesized using solid state reaction and flux growth methods at high temperature under a variety of ambients (e.g., oxygen, inert gas, and vacuum). The phosphor compositions include samples in powder form and in crystal form. In one embodiment, the various compositions were synthesized in the temperature range of 800-1600° C. In a preferred embodiment, the various compositions were synthesized at a temperature range at or above 1000° C. In a more preferred embodiment, the various compositions were synthesized at a temperature range at or above 1300° C.

X-ray diffraction (XRD) data was recorded on a Bruker D8 Discover Diffractometer running on Cu Kα radiation at 40 kV and 40 mA. This data was used to determine the crystal structure of the synthesized phosphors and to calculate their lattice constants. Excitation and Emission Spectrum measurements were carried out using a Flourolog Tau-3 Lifetime Measurement system. The excitation spectra were recorded for specific emission wavelengths. However, aspects of the invention should not be limited to the above devices and systems for reading and measuring. Those skilled in the art will understand the other devices and systems that may be used for reading and measuring. TABLES 1, 2, 3, and 4, shown below, provide representative phosphor compositions synthesized according to embodiments of the present invention.

TABLE 1

| Phosphor composition | Crystal Structure | Charge Transfer Band Edge | CT-Absorbing Group |
|---|---|---|---|
| $Mg_3Y_2MoO_9$: $Eu^{3+}$ | Cubic phase, with octahedrally coordinated $Mo^{6+}$ ion | 400 nm | $MoO_6$ |
| $A_3Y_2MoO_9$: $Eu^{3+}$ (A = Ca, Sr, Ba) | Cubic phase with octahedrally coordinated $Mo^{6+}$ ion | 420-430 nm | $MoO_6$ |
| $Mg_3MoO_6$: $Eu^{3+}$ | orthorhombic phase, with octahedrally coordinated $Mo^{6+}$ ion | 400 nm | $MoO_6$ |
| $A_3MoO_6$: $Eu^{3+}$ (A = Ca, Sr, Ba) | orthorhombic phase, with octahedrally coordinated $Mo^{6+}$ ion | 420-430 nm | $MoO_6$ |
| $A_3Mo_xW_{1-x}O_6$: $Eu^{3+}$ ** (A = Mg, Ca, Sr, Ba) | orthorhombic phase with octahedrally coordinated $Mo^{6+}/W^{6+}$ ion | 340-430 nm; **x = 0 exhibits the highest emission intensity but shortest charge transfer band edge | $MO_6$ (M = Mo, W) |
| $A_5V_2O_{10}$: $Eu^{3+}$ (A = Mg, Ca, Sr, Ba) | Orthorhombic phase with five coordinated $V^{5+}$ ion | 420-430 nm | $VO_6$ |
| $A_3Nb_2O_8$: $Eu^{3+}$ (A = Mg, Ca, Sr, Ba) | Rhombohedral phase with octahedrally coordinated $Nb^{5+}$ ion | 420-430 nm | $NbO_6$ |
| $A_2YBO_6$: $Eu^{3+}$ (A = Mg, Ca, Sr, Ba; B = Ta, Nb) | Monoclinic phase with octahedrally coordinated $B^{5+}$ ion | 420-430 nm | $BO_6$ |
| $AMoO_3$: $Eu^{3+}$ (A = Ca, Sr, Ba) | Orthorhombic phase in A = Ca and cubic phases in A = Sr, Ba with $Mo^{4+}$ state | 415-420 nm | $MoO_4$ |
| $A_2Mo_2O_7$: $Eu^{3+}$ (A = Y, Gd, Lu) | Cubic phase with $Mo^{4+}$ state | 380-400 nm | $MoO_4$ |

TABLE 2

| Phosphor Composition | Peak Emission Wavelength (nm) | Experimentally observed CT Band Edge (nm) | Crystal Structure |
|---|---|---|---|
| $Mg_3Y_2MoO_9$: $Eu^{3+}$ | 611 | 397 | Cubic |
| $Mg_3Y_2WO_9$: $Eu^{3+}$ | 615 | 328 | Cubic |
| $CaWO_4$: $Eu^{3+}$ | 615 | 320 | Tetragonal |
| $CaMoO_4$: $Eu^{3+}$ | 615 | 330 | Tetragonal |
| $Ca_3Y_2MoO_9$: $Eu^{3+}$ | 615 | 418 | Cubic |
| $CaMoO_3$: $Eu^{3+}$ | 615 | 415 | Orthorhombic |
| $SrMoO_4$: $Eu^{3+}$ | 615 | 290 | Tetragonal |
| $SrMoO_3$: $Eu^{3+}$ | 615 | 380 | Cubic |
| $BaMoO_4$: $Eu^{3+}$ | 615 | 325 | Tetragonal |
| $Ba_2CaMoO_6$: $Eu^{3+}$ | 594 | 425 | Cubic |
| $BaMoO_3$: $Eu^{3+}$ | 615 | 388 | Cubic |
| $Ba_3Y_2WO_9$: $Eu^{3+}$ | 615 | 338 | Cubic |
| $Y_2WO_6$: $Eu^{3+}$ | 615 | 329 | Monoclinic |
| $Y_2MoO_6$: $Eu^{3+}$ | 610 | 400 | Monoclinic |
| $Y_2Mo_2O_7$: $Eu^{3+}$ | 615 | 380 | Cubic |
| $Gd_2MoO_6$: $Eu^{3+}$ | 613 | 400 | Monoclinic |

TABLE 3

| Phosphor Composition | Crystal Structure | Peak Emission Wavelength (nm) | Charge Transfer Band Edge (nm) | CT-Absorbing Group |
|---|---|---|---|---|
| $Ca_{0.88}MoO_4$: $Eu_{0.12}^{3+}$ | Tetragonal | 614 | 330 | $MoO_4$ |
| $Ca_{0.88}WO_4$: $Eu_{0.12}^{3+}$ | Tetragonal | 615 | 300 | $WO_4$ |
| $Y_{1.94}(MoO_4)_3$: $Eu_{0.06}^{3+}$ | Orthorhombic | 611 | 320 | $MoO_4$ |
| $Gd_{1.94}(MoO_4)_3$: $Eu_{0.06}^{3+}$ | Orthorhombic | 613 | 320 | $MoO_4$ |
| $Zn_{0.88}MoO_4$: $Eu_{0.12}^{3+}$ | Tricilinic | 613 | 330 | $MoO_4$ |
| $Y_{1.94}MoO_6$: $Eu_{0.06}^{3+}$ | Monoclinic | 609 | 400 | $MoO_5$ |
| $Gd_{1.94}MoO_6$: $Eu_{0.06}^{3+}$ | Monoclinic | 609 | 405 | $MoO_5$ |
| $Ca_{2.88}MoO_6$: $Eu_{0.12}^{3+}$ | Orthorhombic | 615 | 425 | $MoO_6$ |
| $Ca_{2.88}WO_6$: $Eu_{0.12}^{3+}$ | Orthorhombic | 615 | 330 | $WO_6$ |
| $Ba_2Ca_{0.88}MoO_6$: $Eu_{0.12}^{3+}$ | Cubic | 594 | 430 | $MoO_6$ |
| $Y_{5.88}MoO_6$: $Eu_{0.12}^{3+}$ | Hexagonal | 615 | 430 | $MoO_6$ |
| $Gd_{5.88}MoO_6$: $Eu_{0.12}^{3+}$ | Hexagonal | 615 | 430 | $MoO_6$ |
| $Y_{5.88}MoO_6$: $Eu_{0.12}^{3+}$ | Cubic | 615 | ~480 | $MoO_6$ |
| $Gd_{5.88}MoO_6$: $Eu_{0.12}^{3+}$ | Cubic | 615 | ~480 | $MoO_6$ |

TABLE 4

| Phospor Compositions | Generic Formula | Peak Emission (nm) | Charge Transfer Band Edge (nm) |
|---|---|---|---|
| $Mg_{2.9}MoO_6:Eu_{0.1}^{3+}$ | $(A_xA_y\ldots A_z)_{3-(1+q)m}(W_{1-r}Mo_r)O_6:Ln_m, D_{qm}$ | 611 | 420 |
| $Mg_{2.98}MoO_6:Eu_{0.02}^{3+}$ | $(A_xA_y\ldots A_z)_{3-(1+q)m}(W_{1-r}Mo_r)O_6:Ln_m, D_{qm}$ | 594 | 490 |
| $Ca_{2.8}MoO_6:Eu_{0.2}^{3+}$ | $(A_xA_y\ldots A_z)_{3-(1+q)m}(W_{1-r}Mo_r)O_6:Ln_m, D_{qm}$ | 615 | 440 |
| $Sr_{2.88}MoO_6:Eu_{0.12}^{3+}$ | $(A_xA_y\ldots A_z)_{3-(1+q)m}(W_{1-r}Mo_r)O_6:Ln_m, D_{qm}$ | 615 | 410 |
| $Ca_{2.98}WO_6:Dy_{0.02}^{3+}$ | $(A_xA_y\ldots A_z)_{3-(1+q)m}(W_{1-r}Mo_r)O_6:Ln_m, D_{qm}$ | 575 | 400 |
| $Ca_{2.95}WO_6:Eu_{0.1}^{3+}$ | $(A_xA_y\ldots A_z)_{3-(1+q)m}(W_{1-r}Mo_r)O_6:Ln_m, D_{qm}$ | 615 | 400 |
| $Ca_{2.95}WO_6:Sm_{0.05}^{3+}$ | $(A_xA_y\ldots A_z)_{3-(1+q)m}(W_{1-r}Mo_r)O_6:Ln_m, D_{qm}$ | 650 | 400 |
| $Sr_{2.96}WO_6:Eu_{0.04}^{3+}$ | $(A_xA_y\ldots A_z)_{3-(1+q)m}(W_{1-r}Mo_r)O_6:Ln_m, D_{qm}$ | 594 | 490 |
| $Ca_{0.8}MoO_3:Eu_{0.2}^{3+}$ | $(A_xA_y\ldots A_z)_{1-(1+q)m}(W_{1-r}Mo_r)O_3:Ln_m, D_{qm}$ | 615 | 430 |
| $Sr_{0.9}MoO_3:Eu_{0.1}^{3+}$ | $(A_xA_y\ldots A_z)_{1-(1+q)m}(W_{1-r}Mo_r)O_3:Ln_m, D_{qm}$ | 615 | 410 |
| $Ba_{0.8}MoO_3:Eu_{0.2}^{3+}$ | $(A_xA_y\ldots A_z)_{1-(1+q)m}(W_{1-r}Mo_r)O_3:Ln_m, D_{qm}$ | 615 | 410 |
| $Mg_{2.8}Y_2MoO_9:Eu_{0.2}^{3+}$ | $((A_xA_y\ldots A_z)_{3-(1+q)m}(B_xB_y\ldots B_z)_{2-k}(W_{1-r}Mo_r)O_9:Ln_{m+k}, D_{qm}$ | 615 | 420 |
| $Ca_{2.8}Y_2MoO_9:Eu_{0.2}^{3+}$ | $((A_xA_y\ldots A_z)_{3-(1+q)m}(B_xB_y\ldots B_z)_{2-k}(W_{1-r}Mo_r)O_9:Ln_{m+k}, D_{qm}$ | 615 | 440 |
| $Y_{1.8}Mo_2O_7:Eu_{0.2}^{3+}$ | $(A_xA_y\ldots A_z)_{2-m}(W_{1-r}Mo_r)_2O_7:Ln_m$ | 615 | 420 |
| $Ca_{1.8}V_2O_7:Eu_{0.2}^{3+}$ | $(A_xA_y\ldots A_z)_{2-(1+q)m}(V_pNb_rTa_s)_2O_7:Ln_m, D_{qm}$ | 615 | 420 |
| $Ca_{1.95}V_2O_7:Dy_{0.05}^{3+}$ | $(A_xA_y\ldots A_z)_{2-(1+q)m}(V_pNb_rTa_s)_2O_7:Ln_m, D_{qm}$ | 575 | 400 |
| $Ca_{1.95}V_2O_7:Sm_{0.05}^{3+}$ | $(A_xA_y\ldots A_z)_{2-(1+q)m}(V_pNb_rTa_s)_2O_7:Ln_m, D_{qm}$ | 650 | 400 |
| $Ba_{1.8}Nb_2O_7:Eu_{0.2}^{3+}$ | $(A_xA_y\ldots A_z)_{2-(1+q)m}(V_pNb_rTa_s)_2O_7:Ln_m, D_{qm}$ | 615 | 500 |
| $Ca_{2.8}Nb_2O_8:Eu_{0.2}^{3+}$ | $(A_xA_y\ldots A_z)_{3-(1+q)m}(V_pNb_rTa_s)_2O_8:Ln_m, D_{qm}$ | 615 | 400 |
| $Ca_{1.9}YNbO_6:Eu_{0.1}^{3+}$ | $(A_xA_y\ldots A_z)_{2-(1+q)m}(B_xB_y\ldots B_z)_{1-k}(V_pNb_rTa_s)O_6:Ln_{m+k}, D_{qm}$ | 615 | 400 |
| $Ca_{2.8}V_2O_7:Eu_{0.2}^{3+}$ | $(A_xA_y\ldots A_z)_{3-(1+q)m}(V_pNb_rTa_s)_2O_7:Ln_{m+k}, D_{qm}$ | 615 | 430 |
| $Ca_{1.8}V_2O_5:Eu_{0.2}^{3+}$ | $(A_xA_y\ldots A_z)_{2-(1+q)m}(V_pNb_rTa_s)_2O_5:Ln_{m+k}, D_{qm}$ | 615 | 440 |
| $Na_3Y_{0.9}MoO_6:Eu_{0.1}^{3+}$ | $(A_xA_y\ldots A_z)_3(B_xB_y\ldots B_z)_{1-m}(W_{1-r}Mo_r)O_6:Ln_m$ | 615 | 420 |
| $Na_3Y_{0.95}MoO_6:Sm_{0.05}^{3+}$ | $(A_xA_y\ldots A_z)_3(B_xB_y\ldots B_z)_{1-m}(W_{1-r}Mo_r)O_6:Ln_m$ | 650 | 420 |

| Phospor Compositions | Crystal Structure | Charge State of Transition Metal Ion | Absorbing Group | Coordination Number | Synthesis Temperature (° C.) |
|---|---|---|---|---|---|
| $Mg_{2.9}MoO_6:Eu_{0.1}^{3+}$ | Orthorhombic | 6+ | $MoO_6$ | 6 | $\geq 1200$ |
| $Mg_{2.98}MoO_6:Eu_{0.02}^{3+}$ | Orthorhombic | 6+ | $MoO_6$ | 6 | $\geq 1200$ |
| $Ca_{2.8}MoO_6:Eu_{0.2}^{3+}$ | Orthorhombic | 6+ | $MoO_6$ | 6 | $\geq 1200$ |
| $Sr_{2.88}MoO_6:Eu_{0.12}^{3+}$ | Orthorhombic | 6+ | $MoO_6$ | 6 | $\geq 1300$ |
| $Ca_{2.98}WO_6:Dy_{0.02}^{3+}$ | Monoclinic | 6+ | $WO_6$ | 6 | $\geq 1300$ |
| $Ca_{2.95}WO_6:Eu_{0.1}^{3+}$ | Monoclinic | 6+ | $WO_6$ | 6 | $\geq 1300$ |
| $Ca_{2.95}WO_6:Sm_{0.05}^{3+}$ | Monoclinic | 6+ | $WO_6$ | 6 | $\geq 1300$ |
| $Sr_{2.96}WO_6:Eu_{0.04}^{3+}$ | Monoclinic | 6+ | $WO_6$ | 6 | $\geq 1300$ |
| $Ca_{0.8}MoO_3:Eu_{0.2}^{3+}$ | Orthorhombic | 4+ | $MoO_4$ | 4 | $\geq 1100$ |
| $Sr_{0.9}MoO_3:Eu_{0.1}^{3+}$ | Cubic | 4+ | $MoO_4$ | 4 | $\geq 1100$ |
| $Ba_{0.8}MoO_3:Eu_{0.2}^{3+}$ | Cubic | 4+ | $MoO_4$ | 4 | $\geq 1100$ |

TABLE 4-continued

| | | | | | |
|---|---|---|---|---|---|
| $Mg_{2.8}Y_2MoO_9$: $Eu_{0.2}^{3+}$ | Cubic | 6+ | $MoO_6$ | 6 | ≥1200 |
| $Ca_{2.8}Y_2MoO_9$: $Eu_{0.2}^{3+}$ | Cubic | 6+ | $MoO_6$ | 6 | ≥1200 |
| $Y_{1.8}Mo_2O_7$: $Eu_{0.2}^{3+}$ | Cubic | 4+ | $MoO_4$ | 4 | ≥1100 |
| $Ca_{1.8}V_2O_7$: $Eu_{0.2}^{3+}$ | Triclinic | 5+ | $V_2O_7$ | 4 | ≥1100 |
| $Ca_{1.95}V_2O_7$: $Dy_{0.05}^{3+}$ | Triclinic | 5+ | $V_2O_7$ | 4 | ≥1100 |
| $Ca_{1.95}V_2O_7$: $Sm_{0.05}^{3+}$ | Triclinic | 5+ | $V_2O_7$ | 4 | ≥1100 |
| $Ba_{1.8}Nb_2O_7$: $Eu_{0.2}^{3+}$ | Triclinic | 5+ | $Nb_2O_7$ | 4 | ≥1100 |
| $Ca_{2.8}Nb_2O_8$: $Eu_{0.2}^{3+}$ | Rhombohedral | 5+ | $NbO_6$ | 6 | ≥1100 |
| $Ca_{1.9}YNbO_6$: $Eu_{0.1}^{3+}$ | Monoclinic | 5+ | $NbO_6$ | 6 | ≥1100 |
| $Ca_{2.8}V_2O_7$: $Eu_{0.2}^{3+}$ | Triclinic | 4+ | $VO_4$ | 4 | ≥1000 |
| $Ca_{1.8}V_2O_5$: $Eu_{0.2}^{3+}$ | Cubic | 3+ | $VO_4$ | 4 | ≥1000 |
| $Na_3Y_{0.9}MoO_6$: $Eu_{0.1}^{3+}$ | Monoclinic | 6+ | $MoO_6$ | 6 | ≥1100 |
| $Na_3Y_{0.95}MoO_6$: $Sm_{0.05}^{3+}$ | Monoclinic | 6+ | $MoO_6$ | 6 | |

According to another aspect of the present invention, the crystal structures of $Ca_3MoO_6$ and $Ca_3WO_6$ phosphors were determined to be orthorhombic and monoclinic, respectively. In $Ca_3WO_6$ phosphors, the monoclinic angle (90.15°) is very close to 90°; therefore, it is almost an orthorhombic unit cell.

All peaks in the XRD were indexed to Joint Committee on Powder Diffraction Standards (JCPDS) 00-026-1068 and JCPDS 00-022-0541 for $Ca_3MoO_6$ and $Ca_3WO_6$ samples, respectively. Thus, the synthesized phosphors are considered to have high phase purity, and the lanthanide ions were uniformly incorporated in the lattice. The synthesized phosphors form a double perovskite structure with the general formula $A_2B'B''O_6$ (1:1 ordering of B' and B'' site cations), wherein A site cations are 12-coordinated and B' and B'' site cations are octahedrally coordinated by $O^{2-}$ ions. Since there is only one alkaline earth metal cation ($Ca^{2+}$), both A and B' sites are occupied by the same ion. B'' site is occupied by the transition metal ion ($Mo^{6+}$, $W^{6+}$).

Figure 2:
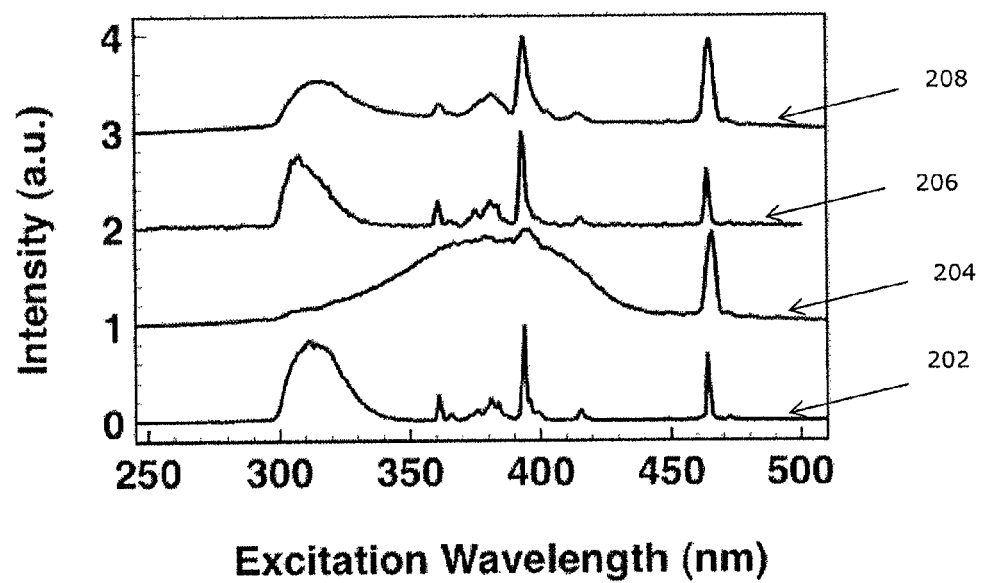
FIG. 2 is a chart of the excitation spectra of four exemplary phosphors in accordance with embodiments of the present invention.

FIG. 2 depicts the excitation spectra of $Ca_3MO_6$:$Eu^{3+}$ (where M=Mo or W) phosphors according to an embodiment of the present invention. The excitation spectra of $CaMO_4$:$Eu^{3+}$ (where M=Mo or W) phosphors with tetrahedral coordination of transition metal ion are also presented for comparison. For referencing purposes, FIG. 2 depicts $CaMoO_4$:$Eu^{3+}$ as element 202, $Ca_3MoO_6$:$Eu^{3+}$ as element 204, $CaWO_4$:$Eu^{3+}$ as element 206, and $Ca_3WO_6$:$Eu^{3+}$ as element 208. As illustrated in FIG. 2, the excitation spectra of $Ca_3MO_6$:$Eu^{3+}$ (where M=Mo or W) phosphors comprise a broad charge transfer band and narrow excitation peaks resulting from f-f transitions.

The charge transfer bands of the phosphor compositions depicted in FIG. 2 originate from $Eu^{3+}$—$O_2^-$, $M^{6+}$+$O^{2-}$ (where M=$Mo^{6+}$ or $W^{6+}$) charge transfer, and IVCT (intervalence charge transfer) between $Eu^{3+}$ and $M^{6+}$ ions. The energies of $Eu^{3+}$—$O^{2-}$ and $M^{6+}$-$O^{2-}$ charge transfer depend upon the covalency of the $Eu^{3+}$—$O^{2-}$ and $M^{6+}$-$O^2$ bonds. Higher covalency leads to lower energy. IVCT is the transition of electrons from the ground 4f state of $Eu^{3+}$ to the excited state of $W^{6+}$/$Mo^{6+}$.

Because the electro-negativity of tungsten is higher than that of molybdenum (Pauling electro-negativity of molybdenum is 2.16 and that of tungsten is 2.36), molybdenum is easily oxidized, lowering the $Mo^{6+}$—$O^{2-}$ bond energy in comparison with $W^{6+}$—$O^{2-}$. Thus, the excited state in tungstates is located at a higher energy than in molybdates, which is also seen from the excitation spectra. Also, while tungsten undergoes an efficient octahedral co-ordination, molybdenum, which is a smaller ion than tungsten, cannot be efficiently coordinated by six $O^{2-}$ ions. Thus, the change from $MoO_4$ to $MoO_6$ group leads to a greater change in the charge transfer band edge than the change from $WO_4$ to $WO_6$ group.

Figure 3:
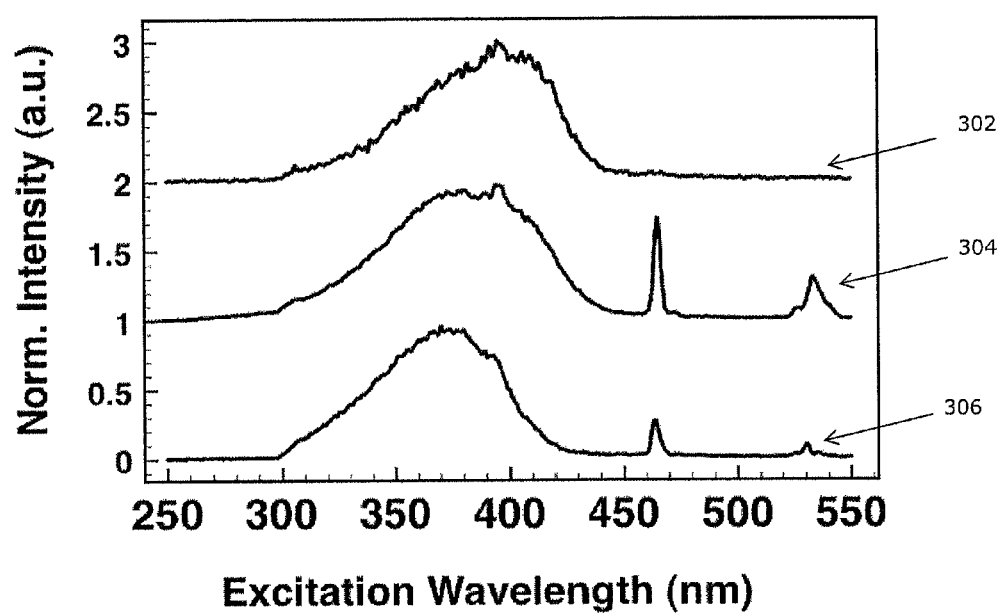
FIG. 3 is a chart of the excitation spectra of three additional exemplary phosphors in accordance with embodiments of the present invention.

FIG. 3 shows the excitation spectra of $Ba_2CaMoO_6$:$Eu^{3+}$ 302, $Ca_3MoO_6$:$Eu^{3+}$ 304, and $Y2MoO6$:$Eu^{3+}$ 306 phosphors, for peak emission wavelengths of 594 nm, 615 nm and 615 nm, respectively. $Ba_2CaMoO_6$:$Eu^{3+}$ 302 and $Y_2MoO_6$:$Eu^{3+}$ 306 phosphors were synthesized by solid-state reaction with 12% dopant concentration for comparison. The crystal structures of these phosphors are cubic, orthorhombic and monoclinic, respectively.

As can be seen from FIG. 3, $Ba_2CaMoO_6$:$Eu^{3+}$ 302 and $Ca_3MoO_6$:$Eu^{3+}$ 304 phosphors exhibited a CTB edge of 430 nm. This is different than the CTB edge of $Y2MoO6$:$Eu^{3+}$ 306, which was 400 nm. The disparity of CTB edge among the phosphor compositions depicted in FIG. 3 is attributed to the crystal structure of $Y_2MoO_6$:$Eu^{3+}$ 306. $Y_2MoO_6$:$Eu^{3+}$ 306 has maximum number of defining lattice parameters for the unit cell, e.g., 4, while the other two phosphors have lattice parameters in the crystal structure of 3 and 1, respectively. Thus, according to one aspect of the present invention, limiting the number of lattice parameters causes the ions to expand the unit cell dimensions. This results in longer bonds, and thus, lower bond energies. For example, a lower $Mo^{6+}$—$O^{2-}$ bond energy results in a CTB at longer wavelengths.

FIGS. 4-15 show various embodiments of the emission spectra and excitation spectra of phosphor compounds according to exemplary phosphor compositions of the present invention. In FIGS. 6a,b-15, $\lambda_{ex}$ represents the monochromatic excitation wavelength used to record the emission spectrum of the phosphor in the wavelength range, as depicted in the figures. In FIGS. 6a,b-13a,b, $\lambda_{em}$ represents the fixed emission wavelength at which the emission intensity was recorded when the phosphor was excited by light in the depicted wavelength range. FIGS. 4-15 will further be described below.

Figure 4:
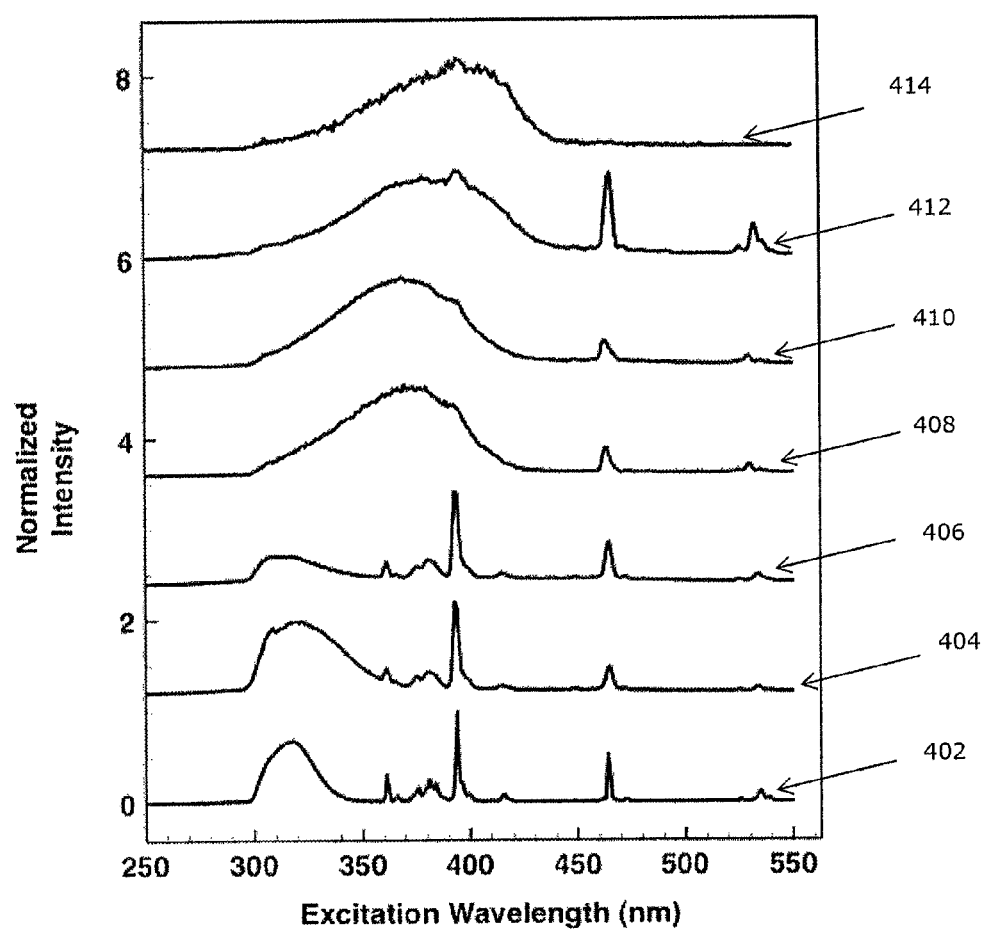
FIG. 4 is a chart of the excitation spectra of seven additional exemplary phosphors in accordance with embodiments of the present invention.

FIG. 4 includes CaMoO$_4$:Eu$^{3+}$ 402, Y$_2$(MoO$_3$)$_4$:Eu$^{3+}$ 404, Gd$_2$(MoO$_3$)$_4$:Eu$^{3+}$ 406, Y$_2$MoO$_6$:Eu$^{3+}$ 408, Gd$_2$MoO$_6$:Eu$^{3+}$ 410, Ca$_3$MoO$_6$:Eu$^{3+}$ 412, Ba$_2$CaMoO$_6$:Eu$^{3+}$ 414 phosphors for the 615 nm emission wavelength.

Figure 5:
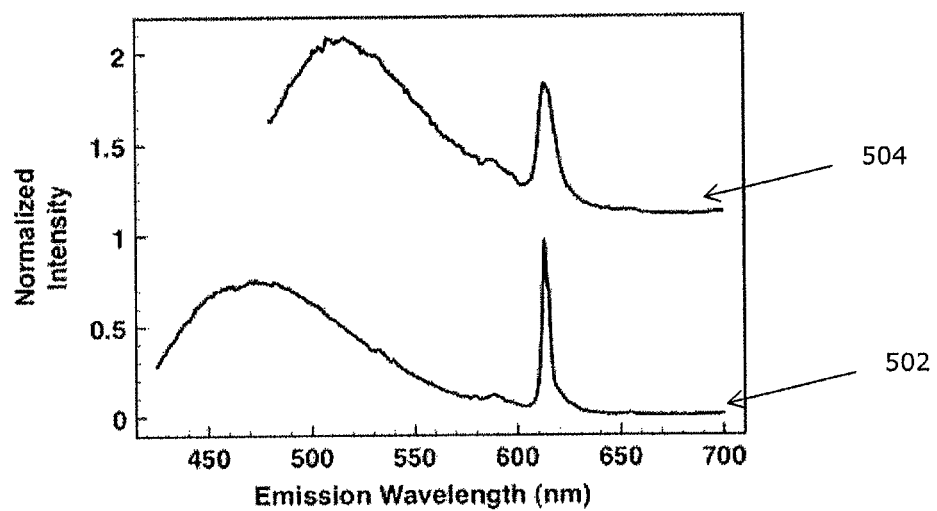
FIG. 5 is a chart of the emission spectra of an exemplary phosphor with 395 nm and 465 nm excitation wavelengths, in accordance with embodiments of the present invention.

FIG. 5 depicts the emission spectra of Ca$_3$MoO$_6$:Eu$^{3+}$ phosphors with 395 nm 502 and 465 nm 504 excitation wavelengths.

Figure 6A:
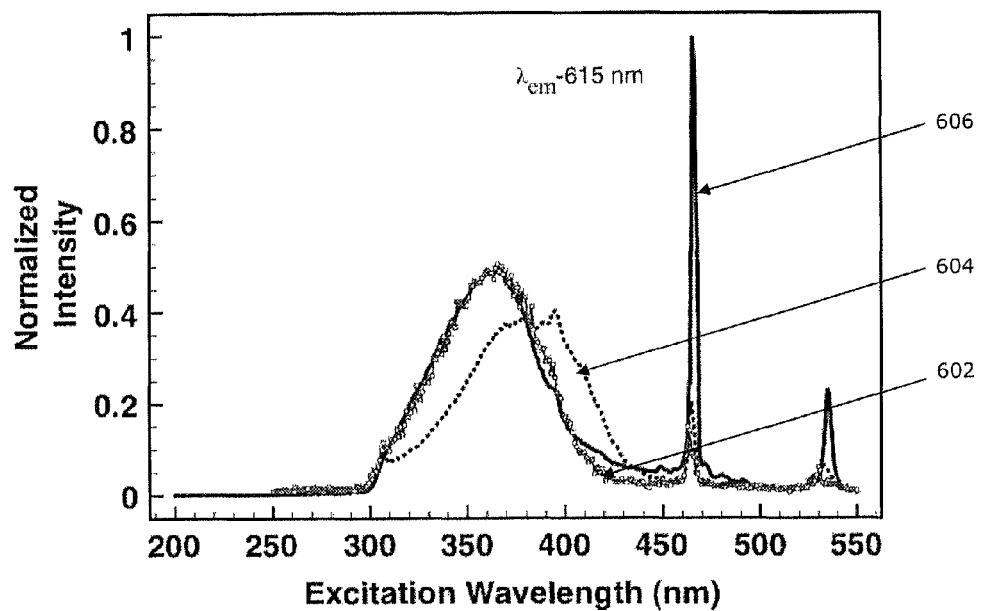
FIGS. 6a, b-13a,b show the excitation and emission spectra of various exemplary phosphor compositions, in accordance with embodiments of the present invention.
Figure 6B:
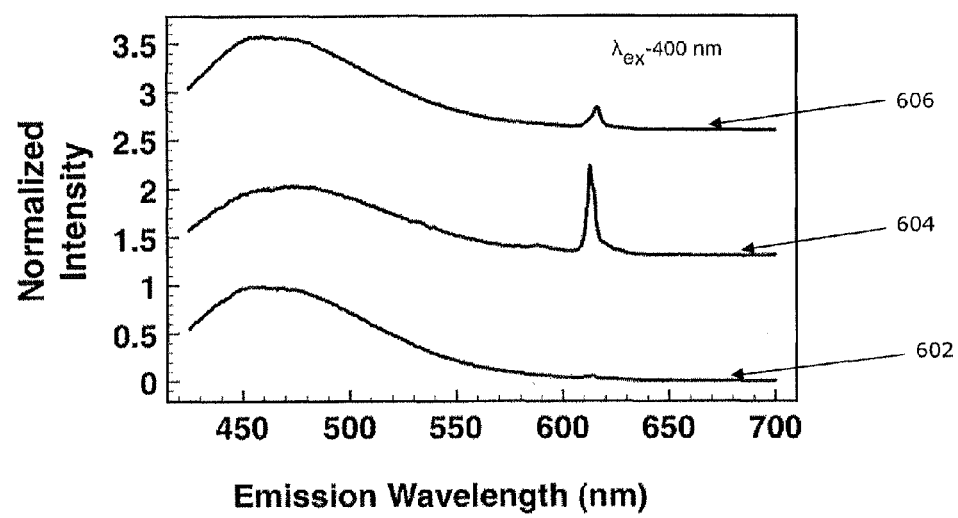

FIGS. 6a, b depict exemplary embodiments of the present invention showing the excitation (FIG. 6a) and Emission Spectra (FIG. 6b) of A$_{2.88}$MoO$_6$:Eu$_{0.12}$$^{3+}$ (where A=Mg 602, Ca 604, or Sr 606). FIG. 6a shows the effectiveness of blue or near-blue LED excitation wavelengths for which the emission wavelength of the phosphor composition is 615 nm (i.e., orange in the visible spectrum). FIG. 6b shows the intensity of the emission wavelengths of the phosphor composition for which the LED wavelength is 400 nm.

Figure 7A:
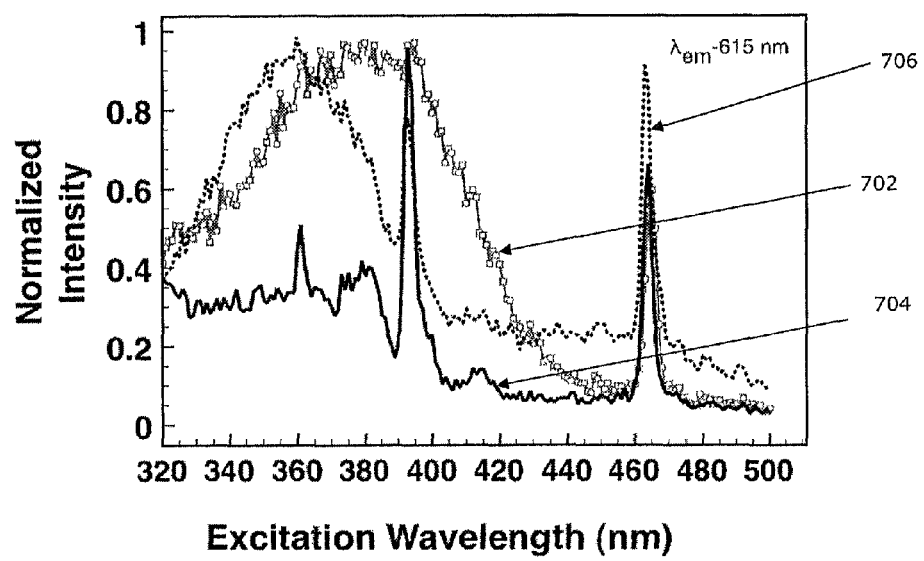
Figure 7B:
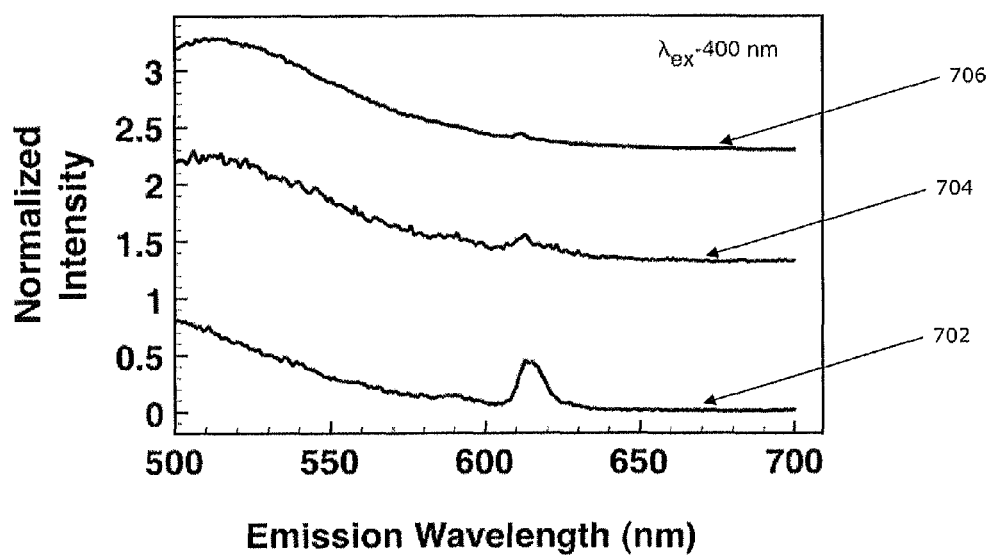

FIGS. 7a, b depict the excitation (FIG. 7a) and emission spectra (FIG. 7b) of A$_{0.88}$MoO$_3$:Eu$_{0.12}$$^{3+}$ (where A=Ca 702, Sr 704, Ba 706). FIG. 7a shows the effectiveness of blue or near-blue LED excitation wavelengths for which the emission wavelength of the phosphor composition is 615 nm (i.e., orange in the visible spectrum). FIG. 7b shows the intensity of the emission wavelengths of the phosphor composition for which the LED wavelength is 400 nm.

Figure 8A:
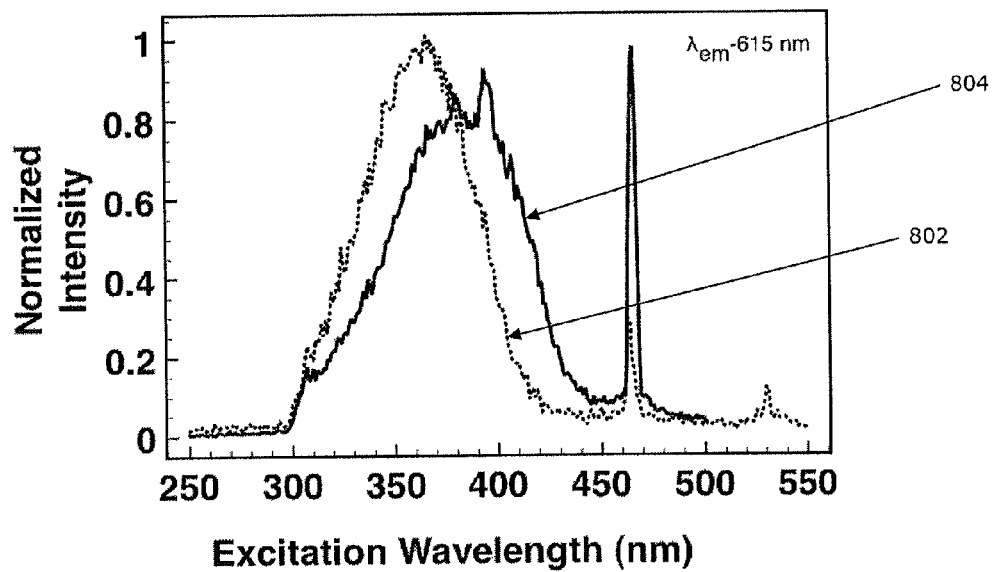
Figure 8B:
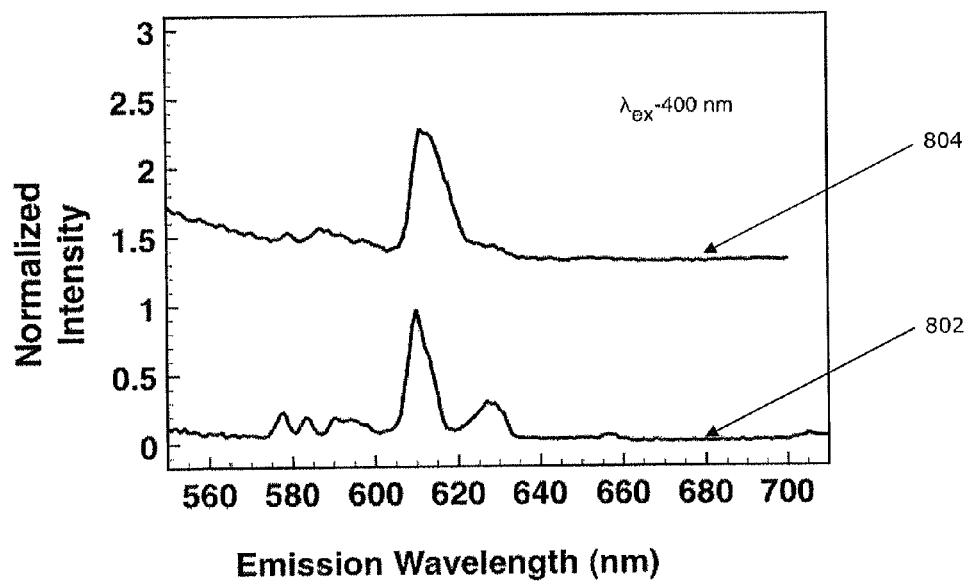

FIGS. 8a, b depict the excitation (FIG. 8a) and emission spectra (FIG. 8b) of A$_{2.58}$Y$_2$MoO$_9$:Eu$_{0.12}$$^{3+}$ (where A=Mg 802, Ca 804). FIG. 8a shows the effectiveness of blue or near-blue LED excitation wavelengths for which the emission wavelength of the phosphor composition is 615 nm (i.e., orange in the visible spectrum). FIG. 8b shows the intensity of the emission wavelengths of the phosphor composition for which the LED wavelength is 400 nm.

Figure 9A:
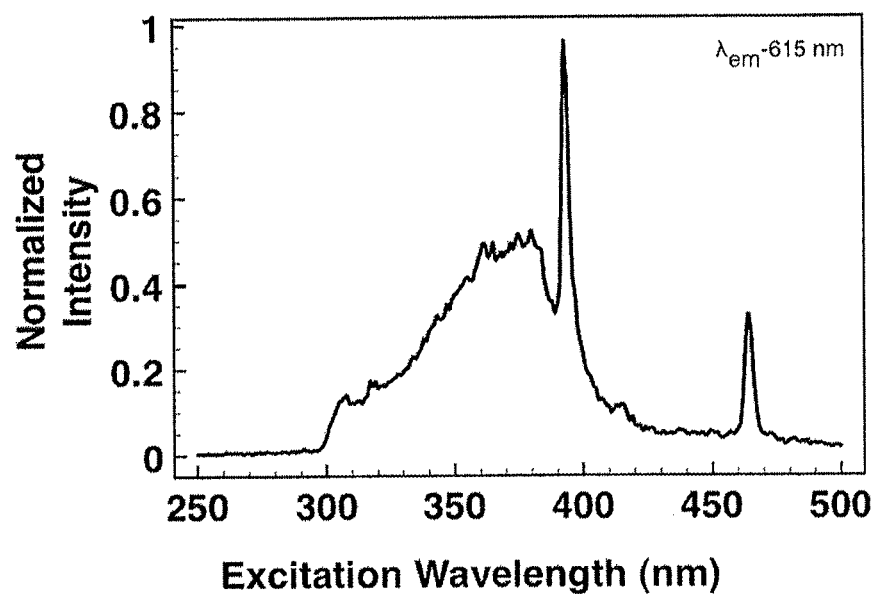
Figure 9B:
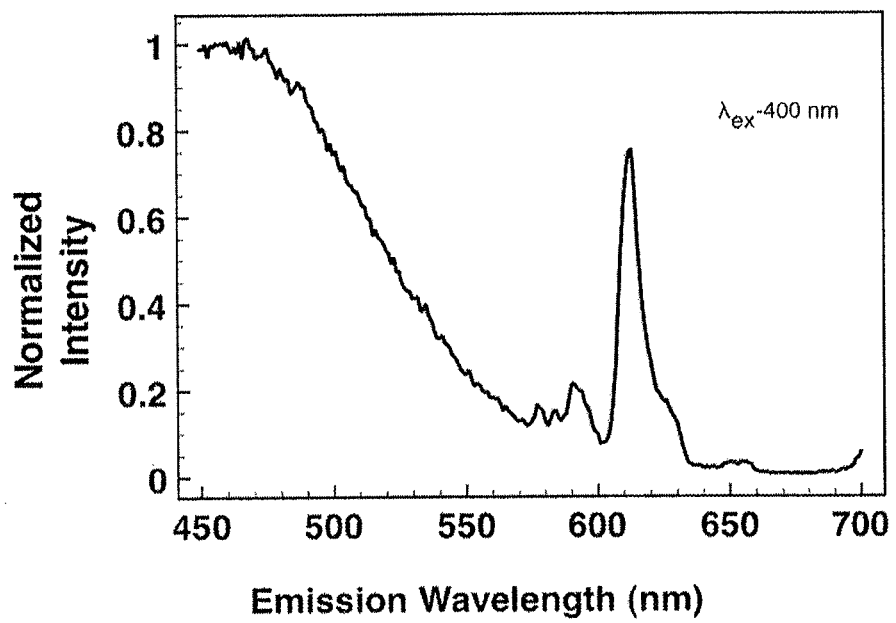

FIGS. 9a, b depict the excitation (FIG. 9a) and emission spectra (FIG. 9b) of Y$_{1.88}$Mo$_2$O$_7$:Eu$_{0.12}$$^{3+}$. FIG. 9a shows the effectiveness of blue or near-blue LED excitation wavelengths for which the emission wavelength of the phosphor composition is 615 nm (i.e., orange in the visible spectrum). FIG. 9b shows the intensity of the emission wavelengths of the phosphor composition for which the LED wavelength is 400 nm.

Figure 10A:
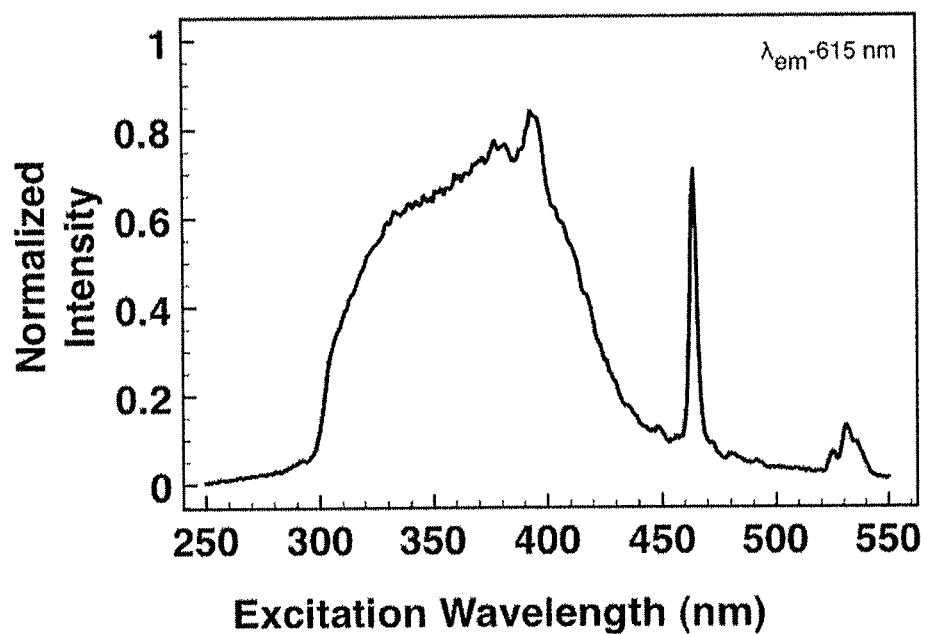
Figure 10B:
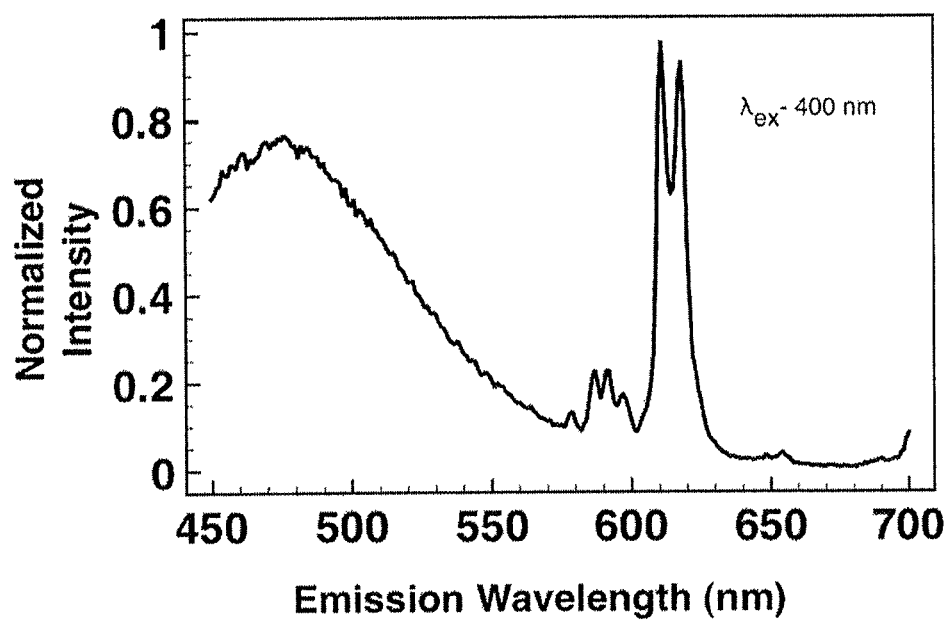

FIGS. 10a, b depict the excitation (FIG. 10a) and emission spectra (FIG. 10b) of Ca$_{1.00}$V$_2$O$_7$:Eu$_{0.12}$$^{3+}$. FIG. 10a shows the effectiveness of blue or near-blue LED excitation wavelengths for which the emission wavelength of the phosphor composition is 615 nm (i.e., orange in the visible spectrum). FIG. 10b shows the intensity of the emission wavelengths of the phosphor composition for which the LED wavelength is 400 nm.

Figure 11A:
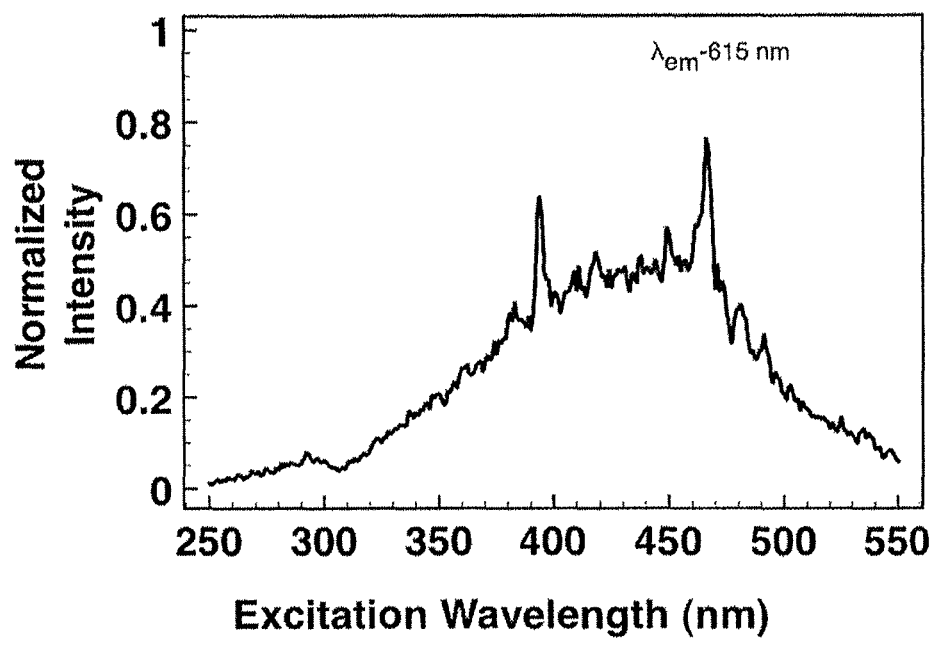
Figure 11B:
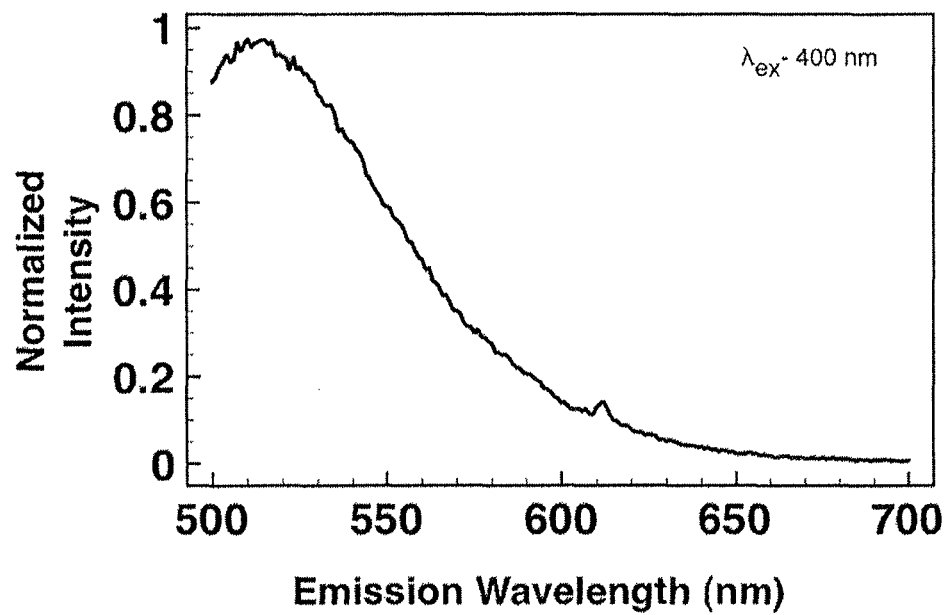

FIGS. 11a, b depict the excitation (FIG. 11a) and emission spectra (FIG. 11b) of Ba$_{1.00}$Nb$_2$O$_2$:Eu$_{0.12}$$^{3+}$. FIG. 11a shows the effectiveness of blue or near-blue LED excitation wavelengths for which the emission wavelength of the phosphor composition is 615 nm (i.e., orange in the visible spectrum). FIG. 11b shows the intensity of the emission wavelengths of the phosphor composition for which the LED wavelength is 400 nm.

Figure 12A:
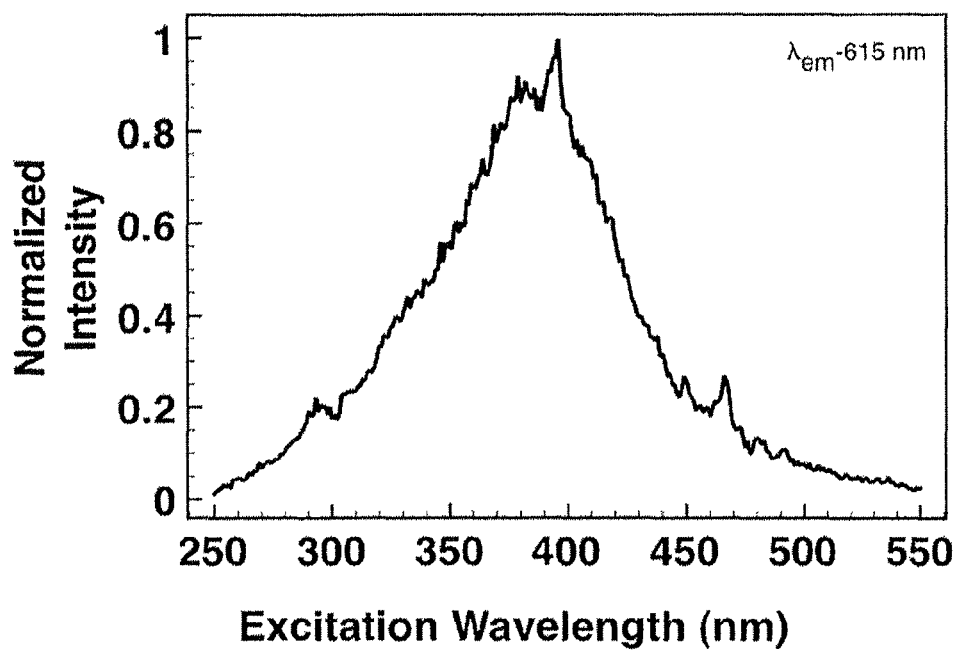
Figure 12B:
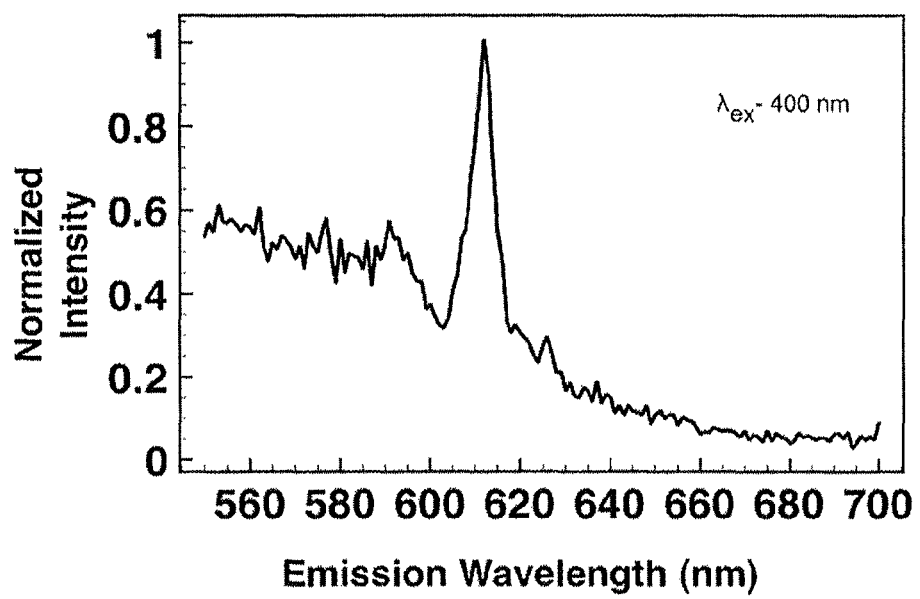

FIGS. 12a, b depict the excitation (FIG. 12a) and emission spectra (FIG. 12b) of Ca$_{2.88}$V$_2$O$_7$:Eu$_{0.12}$$^{3+}$. FIG. 12a shows the effectiveness of blue or near-blue LED excitation wavelengths for which the emission wavelength of the phosphor composition is 615 nm (i.e., orange in the visible spectrum). FIG. 12b shows the intensity of the emission wavelengths of the phosphor composition for which the LED wavelength is 400 nm.

Figure 13A:
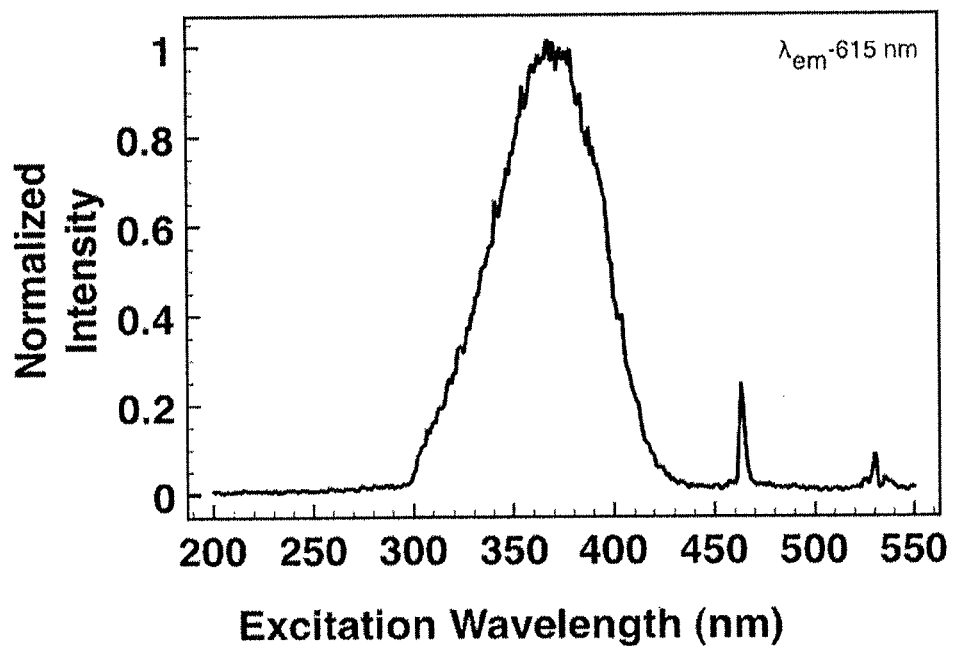
Figure 13B:
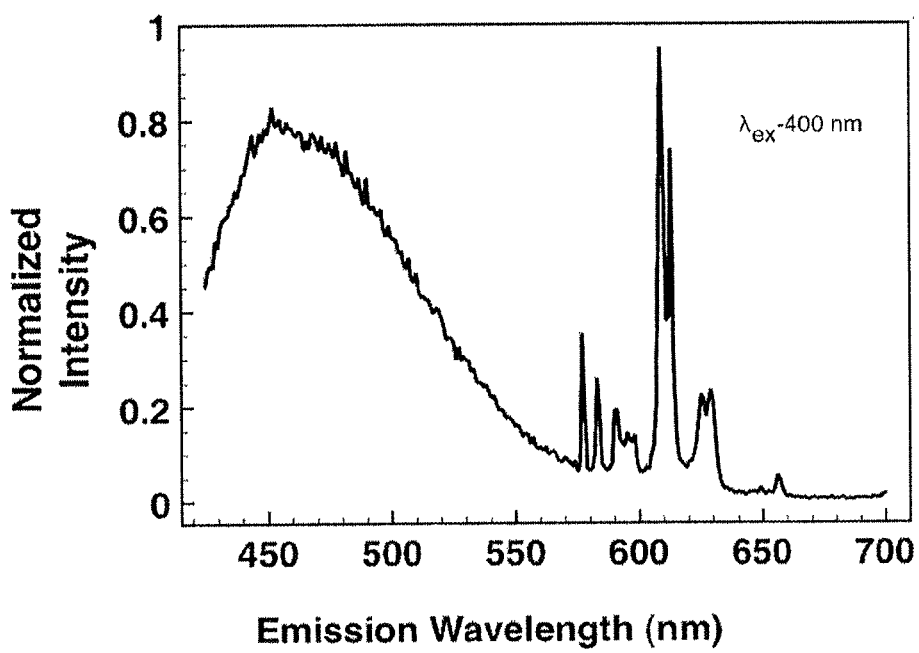

FIGS. 13a, b depict the excitation (FIG. 13a) and emission spectra (FIG. 13b) of Na$_3$Y$_{0.88}$MoO$_6$:Eu$_{0.12}$. FIG. 13a shows the effectiveness of blue or near-blue LED excitation wavelengths for which the emission wavelength of the phosphor composition is 615 nm (i.e., orange in the visible spectrum). FIG. 13b shows the intensity of the emission wavelengths of the phosphor composition for which the LED wavelength is 400 nm.

Figure 14:
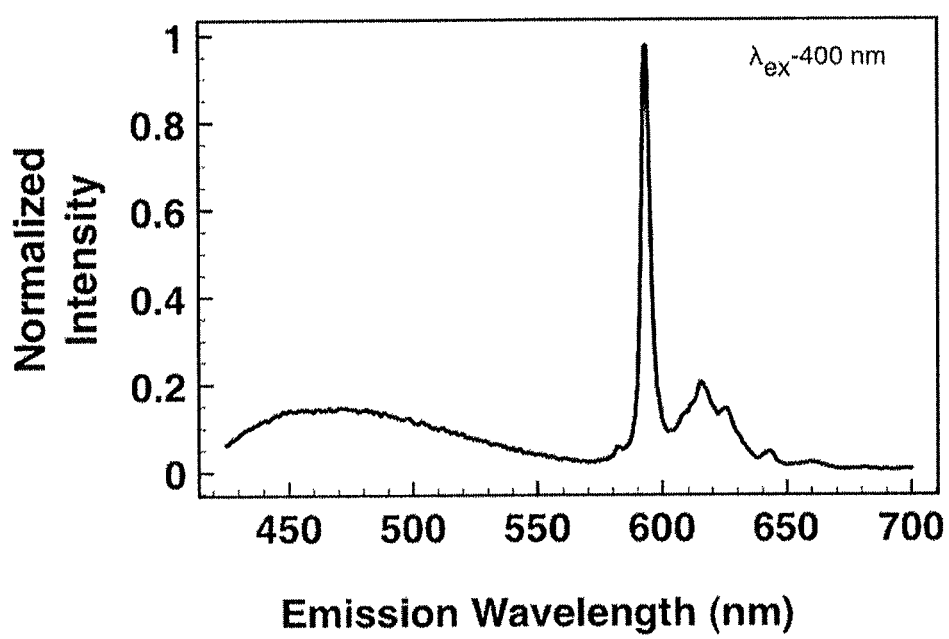
FIG. 14 is a chart of the emission spectrum of an exemplary phosphor excited by a 400 nm LED.

FIG. 14 depicts the intensity of the emission spectrum of Sr$_{2.98}$MoO$_6$:Eu$_{0.02}$$^{3+}$, excited by a 400 nm LED.

Figure 15:
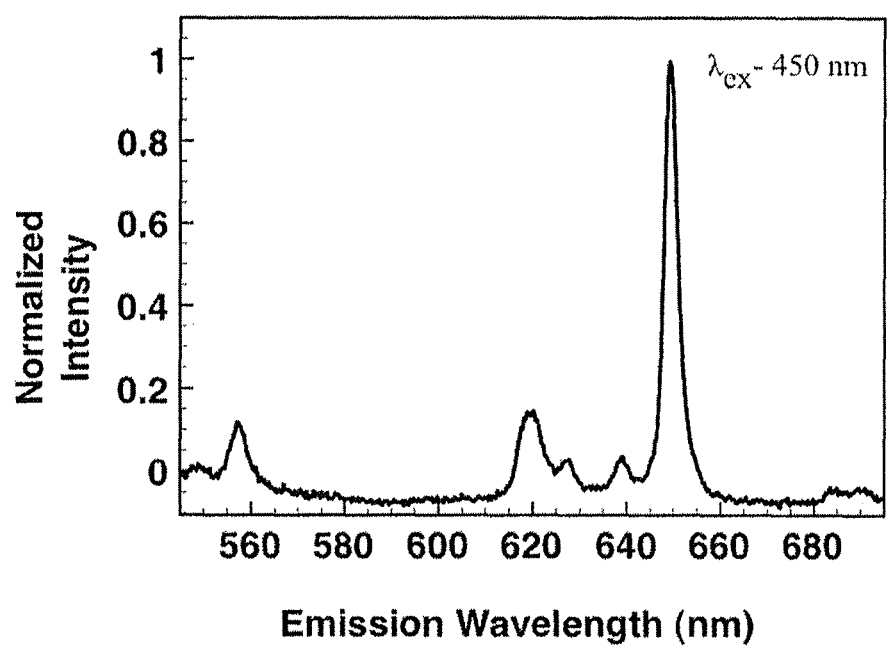
FIG. 15 is a chart of the emission spectrum of another exemplary phosphor excited by a 450 nm LED.

FIG. 15 depicts the intensity of the emission spectrum of Ca$_{2.9}$WO$_6$:Pr$_{0.1}$$^{3+}$, excited by a 450 nm LED.

Figure 16:
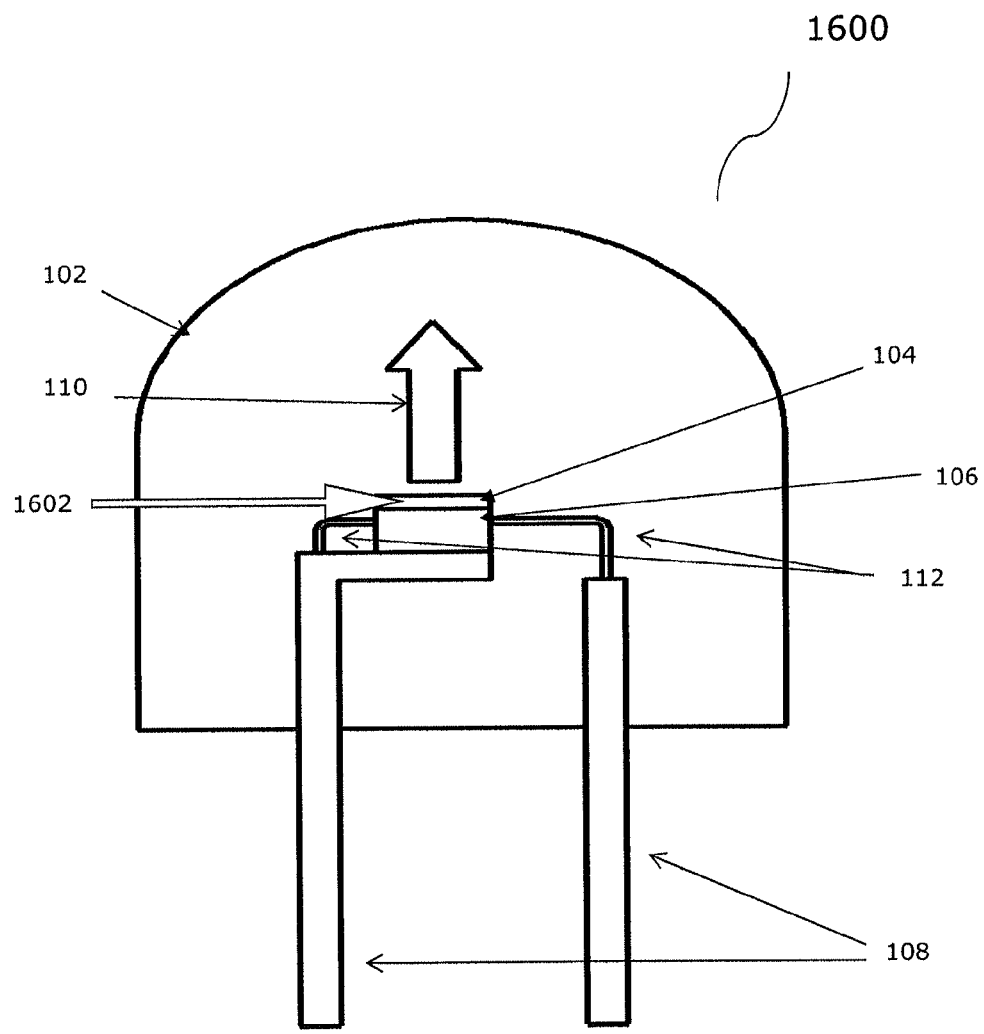
FIG. 16 is a schematic cross-sectional view of an illumination device in accordance with another embodiment of the present invention.

Phosphor compositions 104 according to aspects of the present invention are not limited to converting wavelengths. FIG. 16 depicts a schematic of an LED device 1600 wherein the phosphor composition 104 is agitated by external stimuli 1602. External stimuli 1602 may derive from any one, or more than one, of the following sources: electromagnetic radiation of any wavelength (e.g. x-rays, gamma rays, UV, radio waves, etc.); electrical sources (e.g., electric field); heat sources (e.g., thermal); mechanical sources (e.g. shock waves, acoustic waves, high pressure); magnetic sources (e.g., magnetic field); chemical sources; and biological sources. However, external stimuli 1602 may also derive from sources not listed above. Those skilled in the art will understand the various types of external stimuli 1602 that may be used to agitate a phosphor composition 104.

As a result of the external stimuli 1602, properties of the phosphor composition 104, for example, its refractive index, electrical conductivity, thermal conductivity, magnetic state, etc., may change. These changes may result in changes in the optical absorption, excitation, wavelength conversion, transmission characteristics, etc. of the phosphor composition 104.

If the external stimuli 1602 of the phosphor composition 104 is varied on a periodic basis, the resulting change in the optical properties of the phosphor composition 104 may also be periodic. In addition, the light propagation characteristics through the phosphor composition 104 may also change. Thus, changes in the polarization of light, and the spatial distribution of light transmitted through the phosphor composition, may result. Thus, phosphor compositions 104 according to aspects of the present invention may use the resulting electro-optic, acousto-optic, magneto-optic, and thermo-optic effects to create various devices, e.g., modulators and switches.

While only certain features of the present techniques have been illustrated and described herein, many modifications and changes will occur to those skilled in the art. It is, therefore, to be understood that the appended claims are intended to cover all such modifications and changes as fall within the true spirit of the present techniques.

What is claimed:

1. A phosphor of formula

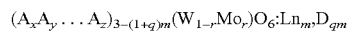

$(A_x A_y \ldots A_z)_{3-(1+q)m}(W_{1-r} Mo_r)O_6 : Ln_m, D_{qm}$ wherein, x+y+ . . . +z=1;

0≤r≤1;

0≤q≤1;

0<m≤0.12;

A=one or more divalent elements from group IIA and IIB;

W=tungsten with a 6+ charge state;

Mo=molybdenum with a 6+ charge state;

Ln=one or more trivalent rare earth lanthanide elements;

D=one or more monovalent elements from group IA and IB; and

O=Oxygen (O$^{2-}$).

2. A phosphor according to claim 1, of formula $Ca_{2.88}MoO_6:Eu_{0.06}Na_{0.06}$.

3. A phosphor according to claim 1, of formula $(Sr_{0.4}Ca_{0.2}Mg_{0.1}Ba_{0.2}Zn_{0.1})_{2.8}(Mo_{0.4}W_{0.6})O_6:Eu_{0.1}Li_{0.1}$.

4. A phosphor of formula $(A_xA_y \ldots A_z)_{1-(1+q)m}(W_{1-r}Mo_r)O_3:Ln_m,D_{qm}$ wherein,
x+y+ . . . +z=1;
0≤r≤1;
0≤q≤1;
0<m≤0.24;
A=one or more divalent elements from group IIA and IIB;
W=tungsten with a 4+ charge state;
Mo=molybdenum with a 4+ charge state;
Ln=one or more trivalent rare earth lanthanide elements;
D=one or more monovalent elements from group IA and IB; and
O=Oxygen ($O^{2-}$).

5. A phosphor according to claim 4, of formula $Ca_{0.80}WO_3:Eu_{0.1}Na_{0.1}$.

6. A phosphor of formula $(A_xA_y \ldots A_z)_{3-(1+q)m}(B_xB_y \ldots B_z)_{2-k}(W_{1-r}Mo_r)O_9:Ln_{m+k},D_{qm}$ wherein,
x+y+ . . . +z=1;
0≤k≤1;
0≤r≤1;
0≤q≤1;
0<m≤0.24;
A=one or more divalent elements from group IIA and IIB;
B=one or more trivalent elements from group IIIA, IIIB or one or more rare earth lanthanide elements;
W=tungsten with a 6+ charge state;
Mo=Molybdenum with a 6+ charge state;
Ln=one or more trivalent rare earth lanthanide elements;
D=one or more monovalent elements from group IA and IB; and
O=Oxygen ($O^{2-}$).

7. A phosphor according to claim 6, of formula $Mg_{2.8}Y_{1.5}WO_9:Eu_{0.6}Na_{0.1}$.

8. A phosphor of formula $(A_xA_y \ldots A_z)_{2-m}(W_{1-r}Mo_r)_2O_7:Ln_m$ wherein,
x+y+ . . . +z=1;
0≤r≤1;
0<m≤1;
A=one or more trivalent elements from group IIIA, IIIB or one or more rare earth lanthanide elements;
W=tungsten with a 4+ charge state;
Mo=molybdenum with a 4+ charge state;
Ln=one or more trivalent rare earth lanthanide elements;
D=one or more monovalent elements from group IA and IB; and
O=Oxygen ($O^{2-}$).

9. A phosphor according to claim 8, of formula $Y_{1.5}Mo_2O_7:Eu_{0.5}$.

10. A phosphor of formula $(A_xA_y \ldots A_z)_{2-(1+q)m}(V_pNb_rTa_s)_2O_7:Ln_m,D_{qm}$ wherein,
x+y+ . . . +z=1;
p+r+s=1;
0≤q≤1;
0<m≤0.24;
A=one or more divalent elements from group IIA and IIB;
V=vanadium with a 5+ charge state;
Nb=niobium with a 5+ charge state;
Ta=tantalum with a 5+ charge state;
Ln=one or more trivalent rare earth lanthanide elements;
D=one or more monovalent elements from group IA and IB; and
O=Oxygen ($O^{2-}$).

11. A phosphor according to claim 10, of formula $Ca_{1.88}V_2O_7:Eu_{0.06}Na_{0.06}$.

12. A phosphor according to claim 10, of formula $Sr_{0.9}Ca_{0.9}V_{0.8}Nb_{1.2}O_7:Eu_{0.1}Li_{0.1}$.

13. A phosphor of formula $(A_xA_y \ldots A_z)_{3-(1+q)m}(V_pNb_rTa_s)_2O_8:Ln_m,D_{qm}$ wherein,
x+y+ . . . +z=1;
p+r+s=1;
0≤q≤1;
0<m≤0.24;
A=one or more divalent elements from group IIA and IIB;
V=vanadium with a 5+ charge state;
Nb=niobium with a 5+ charge state;
Ta=tantalum with a 5+ charge state;
Ln=one or more trivalent rare earth lanthanide elements;
D=one or more monovalent elements from group IA and IB; and
O=Oxygen ($O^{2-}$).

14. A phosphor according to claim 13, of formula $Ca_{2.88}Nb_2O_8:Eu_{0.06}Na_{0.06}$.

15. A phosphor according to claim 13, of formula $Sr_{1.8}Ca_{0.8}V_2O_8:Eu_{0.2}Li_{0.2}$.

16. A phosphor of formula $(A_xA_y \ldots A_z)_{2-(1+q)m}(B_xB_y \ldots B_z)_{1-k}(V_pNb_rTa_s)O_6:Ln_{m+k},D_{qm}$ wherein,
x+y+ . . . +z=1;
p+r+S=1;
0≤q≤1;
0≤k≤1;
0<m≤0.24;
A=one or more divalent elements from group IIA and IIB;
B=one or more trivalent elements from group IIIA, IIIB or one or more rare earth lanthanide elements;
V=vanadium with a 5+ charge state;
Nb=niobium with a 5+ charge state;
Ta=tantalum with a 5+ charge state;
Ln=one or more trivalent rare earth lanthanide elements;
D=one or more monovalent elements from group IA and IB; and
O=Oxygen ($O^{2-}$).

17. A phosphor according to claim 16, of formula $Sr_{1.88}YNbO_6:Eu_{0.06}Na_{0.06}$.

18. A phosphor of formula $(A_xA_y \ldots A_z)_{3-(1+q)m}(V_pNb_rTa_s)_2O_7:Ln_m,D_{qm}$ wherein, x+y+...+z=1;
p+r+s=1;
0≤q≤1;
0<m≤0.24;
A=one or more divalent elements from group IIA and IIB;
V=vanadium with a 4+ charge state;
Nb=niobium with a 4+ charge state;
Ta=tantalum with a 4+ charge state;
Ln=one or more trivalent rare earth lanthanide elements;
D=one or more monovalent elements from group IA and IB; and
O=Oxygen ($O^{2-}$).

19. A phosphor according to claim 18, of formula $Sr_{2.8}VNbO_7:Eu_{0.1}Na_{0.1}$.

20. A phosphor of formula $(A_xA_y...A_z)_{2-(1+q)m}(V_pNb_rTa_s)_2O_5:Ln_m,D_{qm}$ wherein, x+y+...+z=1;
p+r+s=1;
0≤q≤1;
0<m≤0.24;
A=one or more divalent elements from group IIA and IIB;
V=vanadium with a 3+ charge state;
Nb=niobium with a 3+ charge state;
Ta=tantalum with a 3+ charge state;
Ln=one or more trivalent rare earth lanthanide elements;
D=one or more monovalent elements from group IA and IB; and
O=Oxygen ($O^{2-}$).

21. A phosphor according to claim 20, of formula $Mg_{1.6}V_2O_5:Eu_{0.2}Na_{0.2}$.

22. A phosphor of formula $(A_xA_y...A_z)_3(B_xB_y...B_z)_{1-m}(W_{1-r}Mo_r)_6:Ln_m$ wherein, x+y+...+z=1;
0≤r≤1;
0<m≤0.48;
A=one or more monovalent elements from group IA and IB;
B=one or more trivalent elements from group IIIA, IIIB or one or more rare earth lanthanide elements;
W=tungsten with a 6+ charge state;
Mo=molybdenum with a 6+ charge state;
Ln=one or more trivalent rare earth lanthanide elements; and
O=Oxygen ($O^{2-}$).

23. A phosphor according to claim 22, of formula $Na_3Gd_{0.7}MoO_6:Eu_{0.3}$.

24. A light emitting device, comprising:
a source for ultraviolet or visible radiation;
power leads for providing current to the source that causes the source to emit radiation; and
a phosphor as in claim 1 for converting at least a portion of the emitted radiation by the source into radiation having a longer wavelength.

25. A light modulating device, comprising:
a source for ultraviolet or visible radiation;
power leads for providing current to the source that causes the source to emit steady or time varying radiation; and
a phosphor as in claim 4 for converting at least a portion of the emitted radiation by the source into radiation having longer wavelength, wherein the phosphor having optical, electrical, thermal, mechanical, chemical, biological or magnetic properties can be temporally or spatially varied to alter or modulate the temporal or spatial light emission characteristics.

* * * * *